US011915651B2

(12) United States Patent
Shin et al.

(10) Patent No.: US 11,915,651 B2
(45) Date of Patent: Feb. 27, 2024

(54) ELECTROLUMINESCENT DISPLAY

(71) Applicant: LG Display Co., Ltd., Seoul (KR)

(72) Inventors: Sungsoo Shin, Paju-si (KR); Sohee Choi, Paju-si (KR); Yewon Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/005,358

(22) Filed: Jun. 11, 2018

(65) Prior Publication Data
US 2018/0357964 A1 Dec. 13, 2018

(30) Foreign Application Priority Data

Jun. 12, 2017 (KR) .................. 10-2017-0073298

(51) Int. Cl.
*G09G 3/3208* (2016.01)
*G09G 3/3233* (2016.01)
(Continued)

(52) U.S. Cl.
CPC ......... *G09G 3/3258* (2013.01); *G09G 3/3233* (2013.01); *H10K 59/1213* (2023.02); *H10K 59/1216* (2023.02); *H10K 59/131* (2023.02); *G09G 2300/0814* (2013.01); *G09G 2300/0819* (2013.01); *G09G 2310/0289* (2013.01); *G09G 2310/08* (2013.01); *G09G 2320/0219* (2013.01); *G09G 2340/0435* (2013.01); *H01L 27/1225* (2013.01); *H01L 27/1251* (2013.01); *H01L 27/1255* (2013.01); *H01L 29/78675* (2013.01); *H01L 29/7869* (2013.01)

(58) Field of Classification Search
CPC .................... G09G 3/003–3233; G06F 3/0412
See application file for complete search history.

(56) References Cited

U.S. PATENT DOCUMENTS

| 6,160,268 A * | 12/2000 | Yamazaki | ........... H01L 27/1214 257/E21.414 |
| 2005/0030266 A1* | 2/2005 | Nakatogawa | ........ G09G 3/3233 345/76 |

(Continued)

FOREIGN PATENT DOCUMENTS

| KR | 10-2014-0064508 A | 5/2014 |
| KR | 10-2014-0114213 A | 9/2014 |

(Continued)

*Primary Examiner* — Lin Li
(74) *Attorney, Agent, or Firm* — Seed IP Law Group LLP

(57) ABSTRACT

An electroluminescent display including pixels arranged in a matrix is disclosed. Each pixel includes a pixel circuit configured to sample a threshold voltage of a driving element for driving a light emitting element and compensate for a data voltage. The pixel circuit includes a first switch element connected to a data voltage path supplied with the data voltage, a second switch element connected to a reference voltage path supplied with a predetermined reference voltage, a third switch element connected between a gate of the driving element and the first and second switch elements, a fourth switch element connected to an initialization voltage path supplied with a predetermined initialization voltage, and a fifth switch element connected to a power path supplied with a predetermined pixel driving voltage higher than the reference voltage and the initialization voltage.

7 Claims, 18 Drawing Sheets

(51) Int. Cl.
*G09G 3/3258* (2016.01)
*G09G 3/3291* (2016.01)
*H01L 27/12* (2006.01)
*H10K 59/121* (2023.01)
*H10K 59/131* (2023.01)
*H01L 29/786* (2006.01)

(56) References Cited

U.S. PATENT DOCUMENTS

| | | | | |
|---|---|---|---|---|
| 2005/0140605 A1* | 6/2005 | Jung | ............... | G09G 3/3233 345/76 |
| 2010/0001983 A1* | 1/2010 | Abe | ............... | G09G 3/3233 345/76 |
| 2011/0001741 A1* | 1/2011 | Yamamoto | ........... | G09G 3/3233 345/211 |
| 2011/0157143 A1* | 6/2011 | Choi | ............... | G09G 3/3233 345/212 |
| 2013/0043802 A1* | 2/2013 | Han | ............... | G09G 3/3233 315/240 |
| 2014/0139408 A1* | 5/2014 | Kim | ............... | G09G 3/3233 345/76 |
| 2014/0139505 A1* | 5/2014 | Han | ............... | H04N 13/398 345/212 |
| 2014/0146031 A1* | 5/2014 | Lee | ............... | G09G 3/3291 345/212 |
| 2014/0176520 A1* | 6/2014 | Hwang | ............... | G09G 3/003 345/211 |
| 2014/0176523 A1* | 6/2014 | Kwak | ............... | G09G 3/3233 345/212 |
| 2014/0333512 A1* | 11/2014 | In | ............... | G09G 3/3233 345/76 |
| 2014/0333600 A1* | 11/2014 | Lee | ............... | G09G 3/325 345/212 |
| 2015/0029239 A1* | 1/2015 | Park | ............... | G09G 3/3241 345/691 |
| 2015/0061538 A1* | 3/2015 | Miyazawa | ........... | G09G 3/3266 315/291 |
| 2015/0185942 A1* | 7/2015 | Kim | ............... | G06F 3/0412 345/173 |
| 2015/0243203 A1* | 8/2015 | Kim | ............... | G09G 3/3291 345/212 |
| 2016/0190223 A1* | 6/2016 | Park | ............... | H01L 51/0097 257/40 |
| 2016/0246409 A1* | 8/2016 | Yang | ............... | G06F 3/0412 |
| 2016/0379552 A1* | 12/2016 | Kim | ............... | G09G 3/3208 345/76 |
| 2017/0124941 A1* | 5/2017 | Na | ............... | G09G 3/2092 |
| 2017/0278457 A1* | 9/2017 | Zhu | ............... | G09G 3/3233 |
| 2018/0151099 A1 | 5/2018 | Choi et al. | | |
| 2021/0159254 A1* | 5/2021 | Qu | ............... | H01L 27/1225 |

FOREIGN PATENT DOCUMENTS

| | | |
|---|---|---|
| KR | 10-2014-0140736 A | 12/2014 |
| KR | 10-2015-0057190 A | 5/2015 |
| KR | 10-2015-0100459 A | 9/2015 |

* cited by examiner (a)

(b)

(c)

ELECTROLUMINESCENT DISPLAY

CROSS-REFERENCE TO RELATED APPLICATION(S)

This application claims the benefit of Korean Patent Application No. 10-2017-0073298 filed on Jun. 12, 2017, the entire contents of which is incorporated herein by reference for all purposes as if fully set forth herein.

BACKGROUND

Technical Field

The present disclosure relates to an electroluminescent display including a driving element for driving a light emitting element.

Discussion of the Related Art

Examples of flat panel displays include a liquid crystal display (LCD), an electroluminescent display, a field emission display (FED), and a plasma display panel (PDP).

An electroluminescent display is classified into an inorganic electroluminescent display and an organic electroluminescent display depending on a material of an emission layer. An active matrix organic light emitting diode (OLED) display includes a plurality of OLEDs capable of emitting light by themselves and has many advantages of fast response time, high emission efficiency, high luminance, wide viewing angle, and the like.

An OLED includes an anode electrode, a cathode electrode, and an organic compound layer between the anode electrode and the cathode electrode. The organic compound layer generally includes a hole injection layer HIL, a hole transport layer HTL, an emission layer EML, an electron transport layer ETL, and an electron injection layer EIL. When a power voltage is applied to the anode electrode and the cathode electrode, holes passing through the hole transport layer HTL and electrons passing through the electron transport layer ETL move to the emission layer EML and combine, thereby forming excitons. As a result, the emission layer EML generates visible light by the excitons.

Each pixel of the OLED display includes a driving element for controlling a current flowing in the OLED depending on pixel data of an input image. The driving element may be implemented as a transistor. The driving elements of all the pixels have to have the same electrical characteristics including a threshold voltage, mobility, etc. However, the electrical characteristics of the driving elements may not be uniform due to process conditions, a driving environment, and the like. As a driving time of the driving element increases, a stress applied to the driving element increases. An increase in the stress of the driving element accelerates deterioration of the driving element.

To compensate for a variation in electrical characteristics between the driving elements, an internal compensation method and an external compensation method may be applied to the electroluminescent display. The internal compensation method automatically compensates in real time for a variation in electrical characteristics between the driving elements of the pixels using a gate-to-source voltage of the driving element varying depending on the electrical characteristics of the driving element. The external compensation method senses a voltage of the pixel varying depending on the electrical characteristics of the driving element and modulates data of an input image based on the sensed voltage using an external circuit, thereby compensating for a variation in the electrical characteristics between the driving elements of the pixels.

A relatively large parasitic capacitance may be connected to the driving element. The parasitic capacitance of the driving element may reduce a compensation rate when the electrical characteristics of the driving element are compensated. Thus, a reduction (for example, image retention) in the image quality of the electroluminescent display may be caused by the parasitic capacitance of the driving element.

BRIEF SUMMARY

The present disclosure provides an electroluminescent display capable of reducing an influence of a parasitic capacitance connected to a driving element such that electrical characteristics of the driving element are compensated.

Each pixel of an electroluminescent display according to the present disclosure includes a pixel circuit configured to sample a threshold voltage of a driving element for driving a light emitting element and compensate for a data voltage.

The pixel circuit includes a first switch element connected to a data voltage path supplied with a data voltage, a second switch element connected to a reference voltage path supplied with a predetermined reference voltage, a third switch element connected between a gate of the driving element and the first and second switch elements, a fourth switch element connected to an initialization voltage path supplied with a predetermined initialization voltage, a fifth switch element connected to a power path supplied with a predetermined pixel driving voltage that is higher than the reference voltage and the initialization voltage, and a storage capacitor connected between a gate and a source of the driving element.

BRIEF DESCRIPTION OF THE SEVERAL VIEWS OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Figure 1:
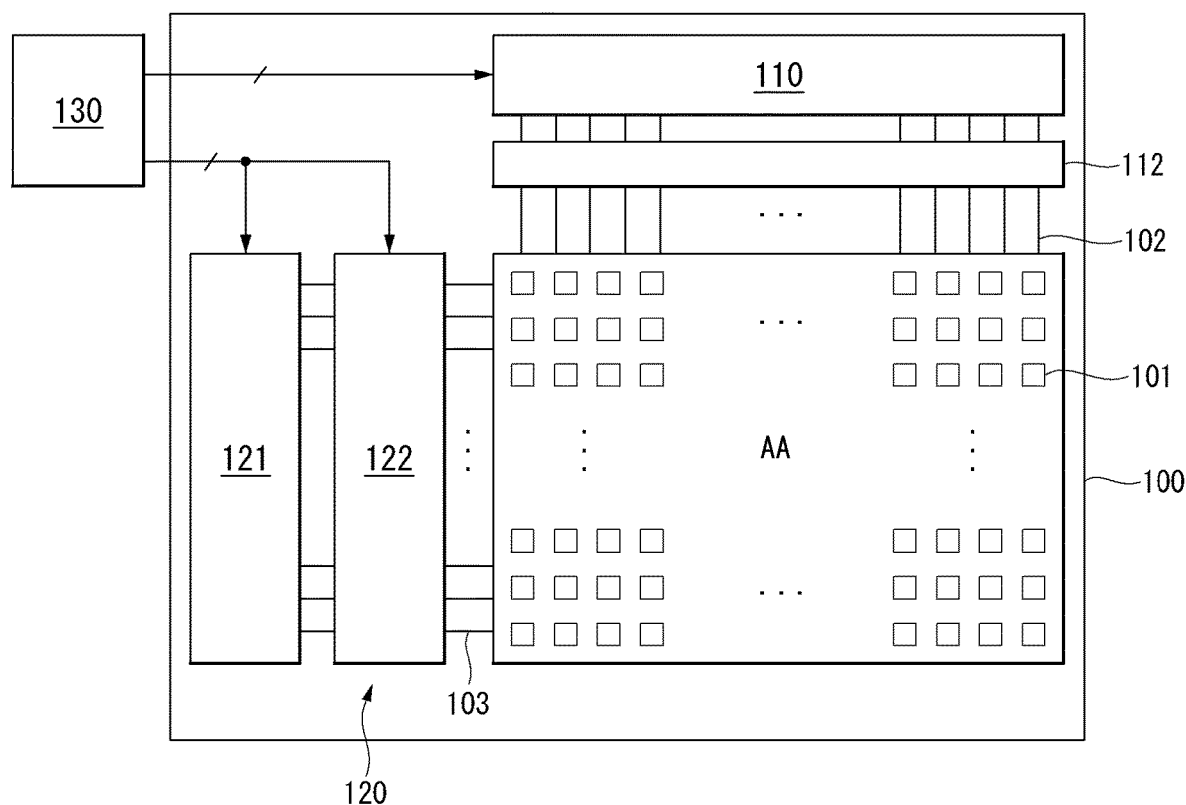
FIG. 1 is a block diagram of an electroluminescent display according to an embodiment of the disclosure.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include," "have," "comprised of," etc. are used, other components may be added unless "only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above," "under or below," "next to" another structure, this description should be construed as including a case in which the structures directly contact each other as well as a case in which a third structure is disposed therebetween.

The terms "first," "second," etc. may be used to distinguish various components. However, functions or structures of the components are not limited by names of the components and ordinal numbers prefixed to the component names. For example, in the following embodiments, ordinal numbers (e.g., first, second, third, and fourth) prefixed to switch elements and driving elements of a pixel circuit do not match ordinal numbers prefixed to elements stated in the claims. For example, a first switch element in embodiments is a first switch element connected to a data voltage path supplied with a data voltage in the claims. A fifth switch element in embodiments is a second switch element connected to a reference voltage path supplied with a reference voltage in the claims. A second switch element in embodiments is a third switch element connected between a gate of a driving element and the first and second switch elements in the claims. A fourth switch element in embodiments is a fourth switch element connected to an initialization voltage path supplied with an initialization voltage in the claims. A third switch element in embodiments is a fifth switch element connected to a power path supplied with a predetermined pixel driving voltage higher than the reference voltage and the initialization voltage in the claims.

The features of embodiments of the disclosure can be partially combined or entirely combined with each other, and can be technically interlocking-driven in various ways. The embodiments can be independently implemented, or can be implemented in conjunction with each other.

A pixel circuit included in an electroluminescent display according to embodiments of the disclosure may include at least one of an n-type thin film transistor (TFT) (or n-type metal oxide semiconductor field effect transistor (MOSFET) (NMOS)) and a p-type TFT (or p-type MOSFET (PMOS)). The TFT is a three-electrode element including a gate, a source, and a drain. The source is an electrode for supplying carriers to the TFT. The carriers inside the TFT begin to flow from the source. The drain is an electrode from which carriers exit the TFT. Namely, carriers in the TFT flow from the source to the drain. In case of the n-type TFT, because carriers are electrons, a source voltage is less than a drain voltage so that electrons can flow from a source to a drain. In the n-type TFT, because electrons flow from the source to the drain, a current flows from the drain to the source. In case of the p-type TFT, because carriers are holes, a source voltage is greater than a drain voltage so that holes can flow from a source to a drain. In the p-type TFT, because holes flow from the source to the drain, a current flows from the source to the drain. In embodiments disclosed herein, the source and the drain of the TFT are not fixed. For example, the source and the drain of the TFT may be changed depending on an applied voltage. Thus, the present disclosure is not limited by the source and the drain of the TFT. In the following description, the source and the drain of the TFT are referred to as a first electrode and a second electrode, respectively.

A gate signal of TFTs used as switch elements swings between a gate-on voltage and a gate-off voltage. The gate-on voltage is set to a voltage greater than a threshold voltage of the TFT, and the gate-off voltage is set to a voltage less than the threshold voltage of the TFT. The TFT is turned on in response to the gate-on voltage and is turned off in response to the gate-off voltage. In case of an n-type TFT (or an NMOS), the gate-on voltage may be a gate high voltage VGH, and the gate-off voltage may be a gate low voltage VGL. In case of a p-type TFT (or a PMOS), the gate-on voltage may be the gate low voltage VGL, and the gate-off voltage may be the gate high voltage VGH.

In the following embodiments, an electroluminescent display will be described using an illustrative example of organic light emitting diode (OLED) display including an organic light emitting material. However, the technical idea of the present disclosure and/or the applicability thereof is not limited to the OLED display. For example, the present disclosure may be applied to an inorganic electroluminescent display including an inorganic electroluminescent material.

Each of pixel circuits of an electroluminescent display according to embodiments of the disclosure includes a compensation circuit. The compensation circuit samples electrical characteristics, for example, a threshold voltage of a driving element for driving a light emitting element and automatically compensates in real time for a data voltage as much as the sampled threshold voltage, in order to improve image quality and lifespan of the electroluminescent display.

Figure 2:
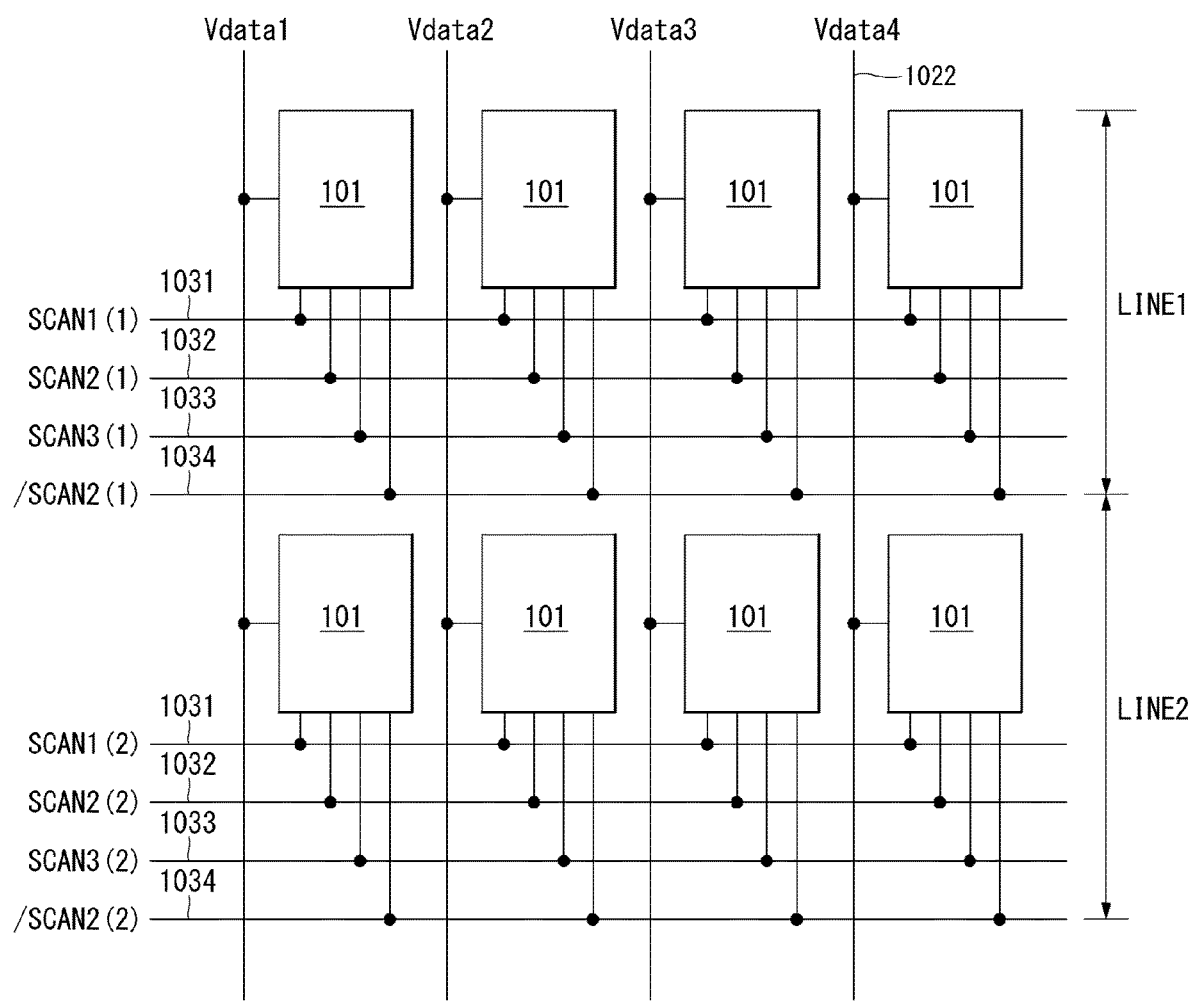
FIG. 2 is a plan view illustrating a connection structure of pixels and signal lines in an enlarged part of a pixel array.
Figure 3:
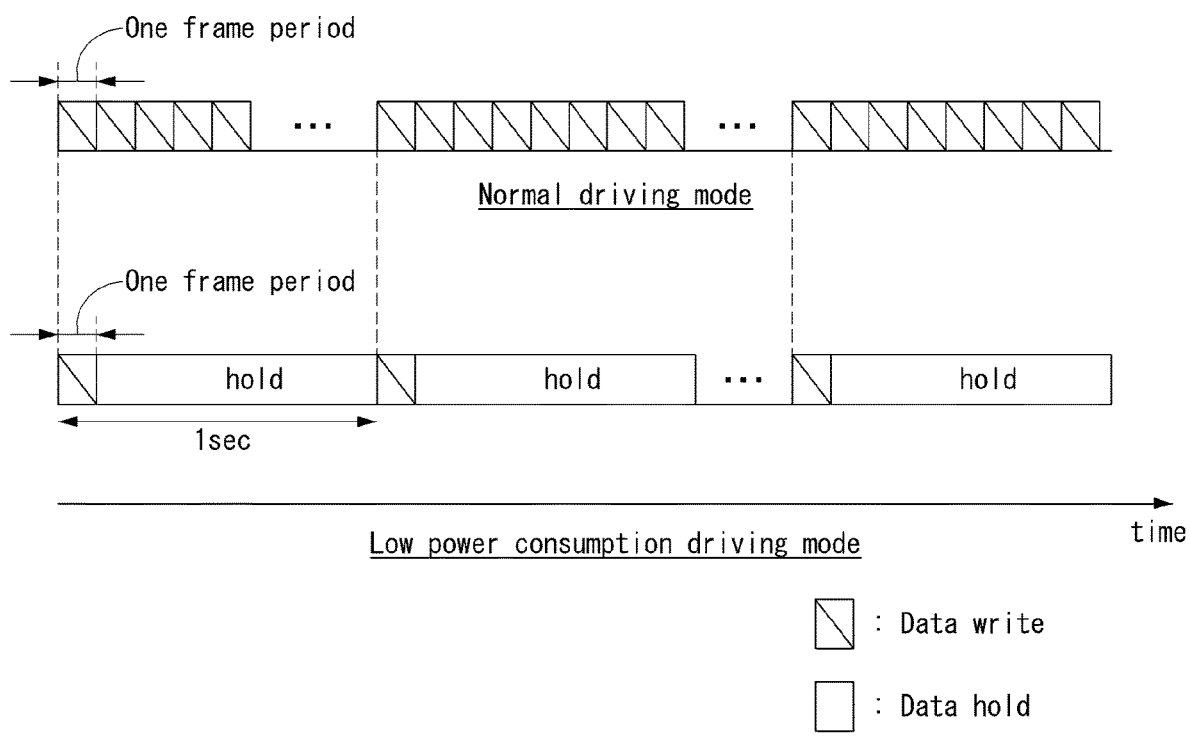
FIG. 3 illustrates a normal driving mode and a low power consumption driving mode.

Referring to FIGS. 1 to 3, an electroluminescent display according to an embodiment of the disclosure includes a display panel 100 and a display panel driving circuit.

The display panel 100 includes an active area AA where an input image is displayed on a screen. A pixel array is disposed in the active area AA. The pixel array includes a plurality of data lines 102, a plurality of gate lines 103 intersecting the data lines 102, and pixels arranged in a matrix.

Each pixel may include a red subpixel, a green subpixel, and a blue subpixel for color implementation. Each pixel may further include a white subpixel. Each subpixel 101 includes a pixel circuit. The pixel circuit includes a light emitting element, a driving element for driving the light emitting element depending on pixel data of an input image, one or more switch elements turned on or off in response to a gate signal, a storage capacitor for sampling a threshold voltage of the driving element, and the like. The driving element and the switch element may be implemented as n-type or p-type TFTs, NMOS or PMOS transistors.

The display panel 100 may further include a first power line for supplying a pixel driving voltage or a high potential driving voltage VDD to the subpixels 101, a second power line for supplying an initialization voltage VIM to the subpixels 101, a VSS electrode for supplying a low potential power voltage VSS to the pixels, a third power line for supplying a reference voltage Vref to the subpixels 101, and the like. The power lines and the VSS electrode are connected to a power circuit (not shown). The VDD is a voltage higher than the VSS, the VINI, and the Vref.

Touch sensors may be disposed on the display panel 100. A touch input may be sensed using separate touch sensors or sensed through the pixels. The touch sensors may be implemented as on-cell touch sensors or add-on touch sensors and disposed on the screen of the display panel 100. Alternatively, the touch sensors may be implemented as in-cell touch sensors that are embedded in the pixel array.

The display panel driving circuit includes a data driver 110 and a gate driver 120. A demultiplexer 112 may be disposed between the data driver 110 and the data lines 102.

The display panel driving circuit (110, 112, and 120) writes data of an input image to the pixels of the display panel 100 under the control of a timing controller 130.

The display panel driving circuit may further include a touch sensor driver for driving the touch sensors. The touch sensor driver is omitted in FIG. 1. In mobile devices or wearable devices, the display panel driving circuit, the timing controller 130, and the power circuit may be integrated into one integrated circuit.

The data driver 110 converts pixel data of an input image received from the timing controller 130 into a gamma compensation voltage and generates a data signal. The data driver 110 outputs a voltage (hereinafter referred to as "data voltage") of the data signal in each channel through an output buffer. The demultiplexer 112 is disposed between the data driver 110 and the data lines 102 using a plurality of switch elements and distributes the data voltage output from the data driver 110 to the data lines 102. Because each channel of the data driver 110 is dividedly connected to the plurality of data lines 102 by the demultiplexer 112, the number of data lines 102 can decrease.

Figure 5:
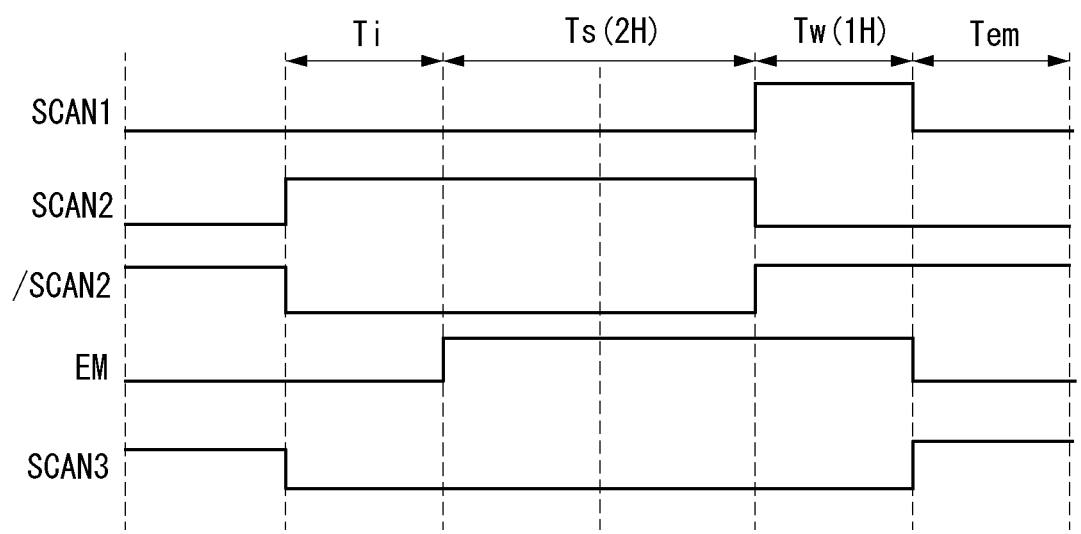
FIGS. 5 and 6 are waveform diagrams illustrating a method of driving a pixel circuit shown in FIG. 4.

The gate driver 120 may be implemented as a GIP (gate-in panel) circuit directly formed in a bezel area of the display panel 100 together with a TFT array in the active area AA of the display panel. The bezel area is a non-display area outside the active area on the display panel 100. The gate driver 120 outputs gate signals to the gate lines 103 under the control of the timing controller 130. The gate driver 120 shifts the gate signals using a shift register and can sequentially supply the gate signals to the gate lines 103. As shown in FIG. 5, the gate signal includes scan signals SCAN1 to SCAN3 and an emission control signal (hereinafter referred to as "EM signal").

The gate driver 120 may include a first gate driver 121 and a second gate driver 122. The first gate driver 121 outputs the scan signals SCAN1 to SCAN3 and shifts the scan signals SCAN1 to SCAN3 in response to a shift clock. The second gate driver 122 outputs the EM signal and sequentially shifts the EM signal EM in response to the shift clock. In case of a display device not having a bezel area, at least some or all of switch elements constituting the first and second gate drivers 121 and 122 may be dividedly disposed in the active area AA.

The timing controller 130 receives digital video data DATA of an input image and timing signals synchronized with the digital video data DATA from a host system (not shown). The timing signals include a vertical sync signal Vsync, a horizontal sync signal Hsync, a data enable signal DE, a clock signal DCLK, and the like. The host system may be one of a television system, a set-top box, a navigation system, a personal computer (PC), a home theater system, a mobile device, a wearable device, and other systems that include or operate in conjunction with a display device.

In a normal driving mode, the timing controller 130 may control a frame rate to be higher than an input frame frequency. For example, the timing controller 130 multiplies the input frame frequency by "i" and can control operation timing of the display panel driving circuit (110, 112, and 120) at a frame frequency of (input frame frequency×i) Hz, where "i" is a positive integer greater than zero. The input frame frequency is 50 Hz in a phase alternate line (PAL) scheme and is 60 Hz in a national television standards committee (NTSC) scheme. In a low power consumption driving mode, the timing controller 130 may reduce the frame frequency to 1 Hz to 30 Hz to reduce a refresh rate of the pixels.

The timing controller 130 generates a data timing control signal for controlling operation timing of the data driver 110, a switch control signal for controlling operation timing of the demultiplexer 112, and a gate timing control signal for controlling operation timing of the gate driver 120 based on the timing signals Vsync, Hsync, DE, and DCLK received from the host system. A voltage level of the gate timing control signal output from the timing controller 130 may be converted into a gate-on voltage and a gate-off voltage through a level shifter (not shown) and may be supplied to the gate driver 120. The level shifter converts a low level voltage of the gate timing control signal into a gate low voltage VGL and converts a high level voltage of the gate timing control signal into a gate high voltage VGH.

As shown in FIG. 3, in the normal driving mode, the display panel driving circuit (110, 112, and 120) writes data of an input image to the pixels in each frame period and thus writes new data to the pixels in each frame period. On the contrary, in the low power consumption driving mode, the display panel driving circuit (110, 112, and 120) reduces the frame rate. As a result, in the low power consumption driving mode, a driving frequency of the display panel driving circuit (110, 112, and 120) and a driving frequency of the display panel 100 are reduced, and power consumption is reduced.

In the normal driving mode, the frame rate may be set to 60 Hz. In the normal driving mode, the display panel driving circuit (110, 112, and 120) writes data of 60 frames per second to the pixels. The driving frequency of the display panel driving circuit (110, 112, and 120) and driving frequencies of the pixels in the low power consumption driving mode are lower than those in the normal driving mode in which an image is displayed on the screen. For example, in the low power consumption driving mode, the frame rate may be reduced to 1 Hz. Image data written to the pixels in the low power consumption driving mode is updated to a lower frequency than the normal driving mode. In an example illustrated in FIG. 3, in the low power consumption driving mode, the display panel driving circuit (110, 112, and 120) writes data of an input image to the pixels in a first frame period (16.67 ms) among 60 frame periods and outputs no data during remaining 59 frame periods. In the low power consumption driving mode, the pixels write data once per second in the first frame period and maintain an image displayed with the data voltage stored in the storage capacitor for most of remaining time.

Figure 4:
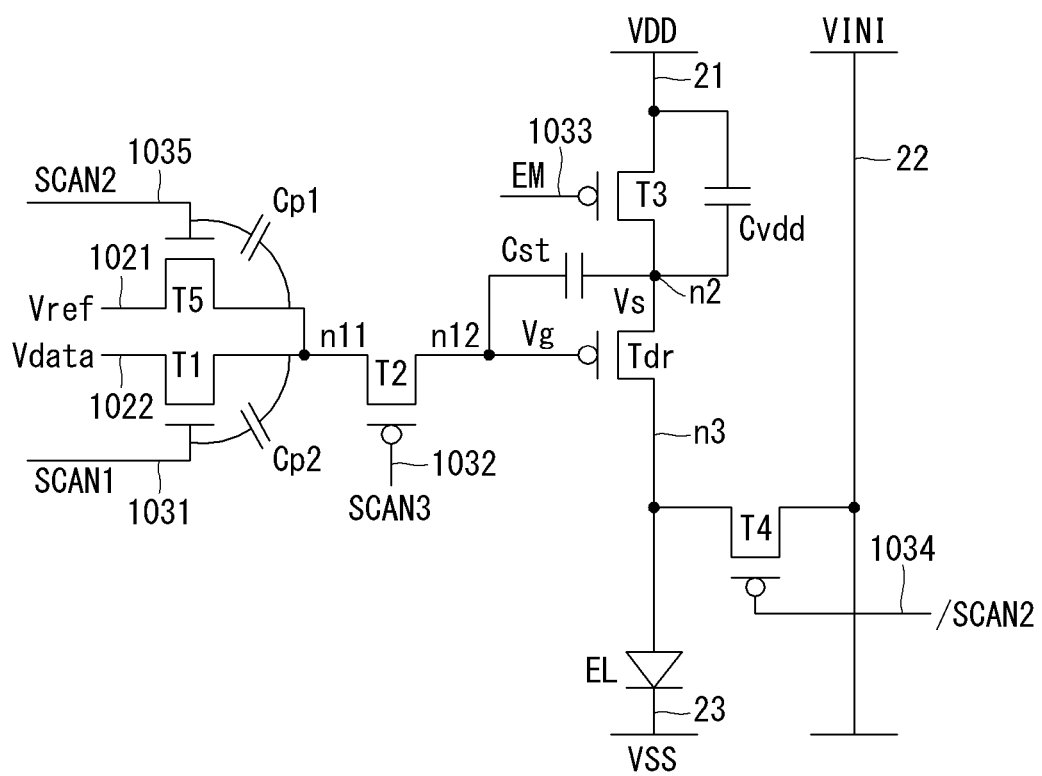
FIG. 4 is a circuit diagram of a pixel circuit according to a first embodiment of the disclosure.
Figure 6:
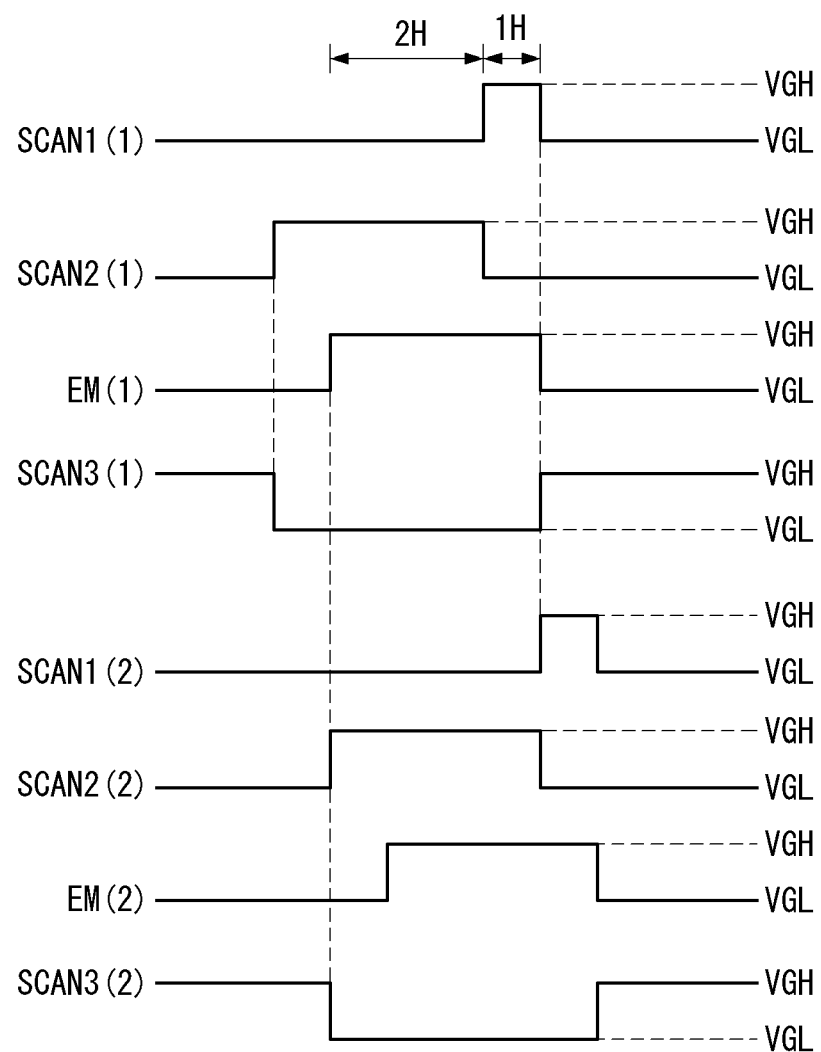

FIG. 4 is a circuit diagram of a pixel circuit according to a first embodiment of the disclosure. The pixel circuit shown in FIG. 4 includes an internal compensation circuit using a plurality of switch elements. FIG. 5 is a waveform diagram illustrating a method of driving the pixel circuit shown in FIG. 4. FIG. 6 is a waveform diagram illustrating gate signals applied to pixels shown in FIG. 2.

Referring to FIGS. 4 to 6, the pixel circuit according to the first embodiment of the disclosure includes a driving element Tdr connected to a light emitting element EL, first to fifth switch elements T1 to T5, a storage capacitor Cst, and other components. The high potential driving voltage VDD is supplied to the pixel circuit through a first power line 21. The initialization voltage VINI is supplied to the pixel circuit through a second power line 22. The low potential power voltage VSS is supplied to the pixel circuit through a VSS electrode 23. The Vref is supplied to the pixel circuit through a third power line 1021.

Each of the first and fifth switch elements T1 to T5 may be implemented as an oxide TFT including an oxide semiconductor pattern. The oxide TFT may be formed as an NMOS of a bottom gate structure in which a gate is disposed below the oxide semiconductor pattern. Because a leakage current generated in an off-state of the oxide TFT is small, the oxide TFT can reduce the power consumption and also prevent a voltage reduction of the pixel resulting from the leakage current. As a result, the oxide TFT can increase a flicker prevention effect.

Each of the driving element Tdr and the second to fourth switch elements T2 to T4 may be implemented as a low-temperature polycrystalline silicon (LTPS) TFT. The LTPS TFT has high charge mobility and excellent reliability. The LTPS TFT may be formed as a PMOS of a top gate structure in which a gate is disposed on a semiconductor pattern.

The light emitting element EL may be implemented as an OLED. The OLED emits light with a current that is controlled depending on a data voltage Vdata by the driving element Tdr. The OLED includes an organic compound layer between an anode and a cathode. The anode of the OLED is connected to the driving element Tdr and the fourth switch element T4 via a third node n3. The cathode of the OLED is connected to the VSS electrode 23. The organic compound layer may include a hole injection layer HIL, a hole transport layer HTL, an emission layer EML, an electron transport layer ETL, and an electron injection layer EIL. However, embodiments are not limited thereto. The storage capacitor Cst is connected between a gate and a source (or referred to as "first electrode") of the driving element Tdr through a 1-2 node n12 and a second node n2.

The first switch element T1 supplies the data voltage Vdata to a 1-1 node n11 in response to the first scan signal SCAN1 for a data writing time Tw. The first switch element T1 includes a gate connected to a first gate line 1031 supplied with the first scan signal SCAN1, a first electrode connected to a data line 1022, and a second electrode connected to the 1-1 node n11.

The fifth switch element T5 supplies the Vref to the 1-1 node n11 in response to the second scan signal SCAN2 for an initialization time Ti and a sampling time Ts prior to the data writing time Tw. The Vref is set to a voltage lower than the VDD. The fifth switch element T5 includes a gate connected to a fifth gate line 1035 supplied with the second scan signal SCAN2, a first electrode connected to the third power line 1021, and a second electrode connected to the 1-1 node n11.

The second switch element T2 connects the 1-1 node n11 to the 1-2 node n12 in response to the third scan signal SCAN3 for the initialization time Ti and the sampling time Ts. The 1-1 node n11 is connected to the second electrode of the first switch element T1 and the second electrode of the fifth switch element T5. The 1-2 node n12 is connected to the gate of the driving element Tdr and a first electrode of the storage capacitor Cst. A second electrode of the storage capacitor Cst is connected to the second node n2. The second switch element T2 includes a gate connected to a second gate line 1032 supplied with the third scan signal SCAN3, a first electrode connected to the 1-1 node n11, and a second electrode connected to the 1-2 node n12. The second switch element T2 reduces a parasitic capacitance connected to the gate of the driving element Tdr for the initialization time Ti and the sampling time Ts. This will be further described in detail with reference to FIGS. 10 and 11.

The third switch element T3 switches a current path between the first power line 21 supplied with the VDD and the driving element Tdr in response to the EM signal EM. The third switch element T3 includes a gate connected to a third gate line 1033 supplied with the EM signal EM, a first electrode to which the VDD is applied through the first power line 21, and a second electrode connected to the second node n2. A capacitor Cvdd may be formed between the first electrode and the second electrode of the third switch element T3.

The fourth switch element T4 supplies the VINI to the third node n3 in response to an inverted second scan signal /SCAN2 for the initialization time Ti and the sampling time Ts. The inverted second scan signal /SCAN2 is an antiphase signal of the second scan signal SCAN2. The fourth switch element T4 includes a gate connected to a fourth gate line 1034 supplied with the inverted second scan signal /SCAN2, a first electrode to which the VINI is applied through the second power line 22, and a second electrode connected to the third node n3.

The driving element Tdr controls the current of the light emitting element EL depending on a source-to-gate voltage Vsg for an emission time Tem. The driving element Tdr includes a gate connected to the 1-2 node n12, a first electrode connected to the second node n2, and a second electrode connected to the third node n3.

Embodiments of the disclosure separate a data voltage path and a reference voltage path connected to the pixel circuits using the switch elements T1 and T5. When the data voltage path and the reference voltage path are separated from each other as described above, the sampling time Ts in which the Vref is applied to the pixel circuits can be secured to a period of time (for example, two or more horizontal periods 2H) longer than one horizontal period 1H. The sampling time Ts is time required to sense electrical characteristics of the driving element Tdr, for example, a threshold voltage Vth of the driving element Tdr. When the sampling time Ts is too short, the electrical characteristics of the driving element Tdr may be inaccurately sensed. Hence, the electrical characteristics of the driving element Tdr cannot be compensated if the sampling time Ts is too short.

One horizontal period 1H is time required to write data to pixels of one pixel line on the active area of display panel 100. One horizontal period 1H is the same as one cycle of each of the horizontal sync signal Hsync and the data enable signal DE. Data writing times Tw of pixel lines LINE1 and LINE2 (see FIG. 2) of the display panel 100 have to be separated from each other, so that data can be individually written to the pixel lines LINE1 and LINE2. When a data voltage path and a reference voltage path of the pixel circuit are separated, the sampling time Ts can be set to be longer than the data writing time Tw. Therefore, the sampling time Ts can be sufficiently secured in high resolution and high speed display panels in which one horizontal period 1H has a relatively short length. On the other hand, when a data voltage path and a reference voltage path share one data line, the sampling time Ts is shorter than one horizontal period 1H because the sampling time Ts and the data writing time Tw are time-divided within one horizontal period 1H. As a result, the sampling time Ts may be considerably insufficient in the high resolution and high speed display panels.

A gate signal applied to pixels of the first pixel line LINE1 is SCAN1(1), SCAN2(1), SCAN3(1) and EM(1) of FIG. 6. A gate signal applied to pixels of the second pixel line LINE2 is SCAN1(2), SCAN2(2), SCAN3(2) and EM(2) of FIG. 6. The first scan signals SCAN1(1) and SCAN1(2) define the data writing time Tw. The first scan signals SCAN1(1) and SCAN1(2) do not overlap each other so that data can be individually written to the adjacent pixel lines LINE1 and LINE2.

The second scan signals SCAN2(1) and SCAN2(2) define the initialization time Ti and the sampling time Ts. When sampling times Ts of the adjacent pixel lines LINE1 and LINE2 overlap each other, there is no data crosstalk between the adjacent pixel lines LINE1 and LINE2. A pulse width of the second scan signals SCAN2(1) and SCAN2(2) is greater than a pulse width of the first scan signals SCAN1(1) and SCAN1(2). Pulses of the second scan signals SCAN2(1) and SCAN2(2) in the adjacent pixel lines LINE1 and LINE2 overlap each other.

Pulses of the third scan signals SCAN3(1) and SCAN3(2) are generated for the initialization time Ti, the sampling time Ts, and the data writing time Tw. A pulse width of the third scan signals SCAN3(1) and SCAN3(2) is greater than the pulse width of the second scan signals SCAN2(1) and SCAN2(2). Pulses of the third scan signals SCAN3(1) and SCAN3(2) in the adjacent pixel lines LINE1 and LINE2 overlap each other.

Referring to FIGS. 5 and 6, when the initialization time Ti starts, a voltage of the second scan signal SCAN2 is inverted from the VGL to the VGH. On the contrary, when the initialization time Ti starts, voltages of the inverted second scan signal /SCAN2 and the third scan signal SCAN3 are inverted from the VGH to the VGL. Voltages of the first scan signal SCAN1 and the EM signal EM are held at the VGL for the initialization time Ti. The first and fifth switch elements T1 and T5 are NMOS transistors, and the other switch elements T2, T3 and T4 and the driving element Tdr are PMOS transistors. Thus, in the initialization time Ti, the second to fifth switch elements T2, T3, T4 and T5 are turned on, and the nodes n11, n12, n2 and n3 of the pixel circuit are initialized. In this instance, a gate voltage Vg of the driving element Tdr is initialized to the Vref. A drain voltage Vs of the driving element Tdr is initialized to the VINI, and a source voltage Vs of the driving element Tdr is initialized to the VDD. The VDD may be 7V, the Vref may be 3V, the Vini may be −3V, and the VSS may be 0V. However, embodiments are not limited thereto. The power voltages may vary depending on driving characteristics and a driving environment of the display panel.

When the sampling time Ts starts, the voltage of the EM signal EM is inverted to the VGH, and each of the scan signals SCAN1, SCAN2, /SCAN2 and SCAN3 is held at a voltage of a previous state. The first and fifth switch elements T1 and T5 are NMOS transistors, and the other switch elements T2, T3 and T4 and the driving element Tdr are PMOS transistors. Thus, in the sampling time Ts, the second, fourth, and fifth switch elements T2, T4 and T5 are turned on, and the first and third switch elements T1 and T3 are turned off. For the sampling time Ts, a source-to-gate voltage Vsg of the driving element Tdr increases by a threshold voltage Vth of the driving element Tdr, and the threshold voltage Vth is stored in the storage capacitor Cst. In this instance, a gate voltage Vg of the driving element Tdr is the Vref, and a source voltage Vs of the driving element Tdr is Vref+|Vth|. The sampling time Ts is longer than the data writing time Tw. For example, the data writing time Tw may be one horizontal period 1H, and the sampling time Ts may be two horizontal periods 2H.

When the data writing time Tw starts, the voltages of the first scan signal SCAN1 and the inverted second scan signal /SCAN2 are inverted to the VGH. When the data writing time Tw starts, the voltage of the second scan signal SCAN2 is inverted to the VGL. Each of the third scan signal SCAN3 and the EM signal EM is held at a voltage of a previous state. The first and fifth switch elements T1 and T5 are NMOS transistors, and the other switch elements T2, T3 and T4 and the driving element Tdr are PMOS transistors. Thus, in the data writing time Tw, the first and second switch elements T1 and T2 are turned on, and the other switch elements T3, T4 and T5 are turned off. In the data writing time Tw, the source-to-gate voltage Vsg of the driving element Tdr is changed to the data voltage Vdata that is compensated as much as the threshold voltage Vth of the driving element Tdr. In this instance, the gate voltage Vg of the driving element Tdr is the data voltage Vdata, and the source voltage Vs of the driving element Tdr is Vref+|Vth|+Cst/(Cst+CVdd)*(Vdata−Vref).

When the emission time Tem starts, the voltages of the first scan signal SCAN1 and the EM signal EM are inverted to the VGL, and the voltage of the third scan signal SCAN3 is inverted to the VGH. Each of the second scan signal SCAN2 and the inverted second scan signal /SCAN2 is held at a voltage of a previous state. The first and fifth switch elements T1 and T5 are NMOS transistors, and the other switch elements T2, T3 and T4 and the driving element Tdr are PMOS transistors. Thus, in the emission time Tem, the third switch element T3 is turned on, and the other switch elements T1, T2, T4 and T5 are turned off.

For the emission time Tem, a current Ioled flows in the light emitting element EL depending on the source-to-gate voltage Vsg of the driving element Tdr, and the light emitting element EL can emit light with the current Ioled. For the emission time Tem, the EM signal EM may be generated as an AC signal swinging between the gate-on voltage and the gate-off voltage depending on a predetermined pulse width modulation (PWM) duty ratio (unit: %). When the turn-on and the turn-off of the light emitting element EL are repeatedly performed depending on the predetermined PWM duty ratio for the emission time Tem, a flicker and image retention can be prevented or reduced.

The current Ioled flowing in the light emitting element EL through the driving element Tdr is expressed by the following equation: Ioled=k*(Vsg−|Vth|)$^2$=k*(VDD−Vdata−Cst/(Cst+Cp)*(VDD−Vref−Cst/(Cst+CVdd)*(Vdata−Vref)−|Vth|). In the above equation, "k" is a constant determined by a channel ratio W/L, a parasitic capacitance, and mobility of the driving element Tdr, and "Cp" is a parasitic capacitance connected between the second switch element T2 and the gate of the driving element Tdr. As can be seen from the above equation, as the parasitic capacitance Cp increases, a compensation rate of the threshold voltage Vth is reduced. According to the first embodiment of the disclosure, because the parasitic capacitance Cp may be regarded as zero, there is no reduction in the compensation rate of the threshold voltage Vth.

Figure 10:
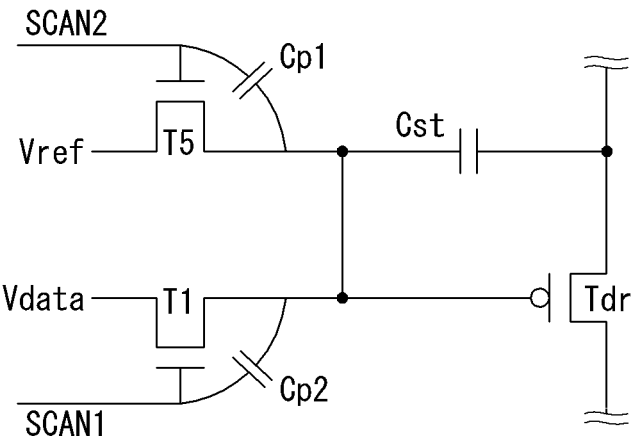
FIG. 10 is a circuit diagram illustrating a reduction in a parasitic capacitance connected to a gate of a driving element when a second switch element is connected to the gate of the driving element.
Figure 10:
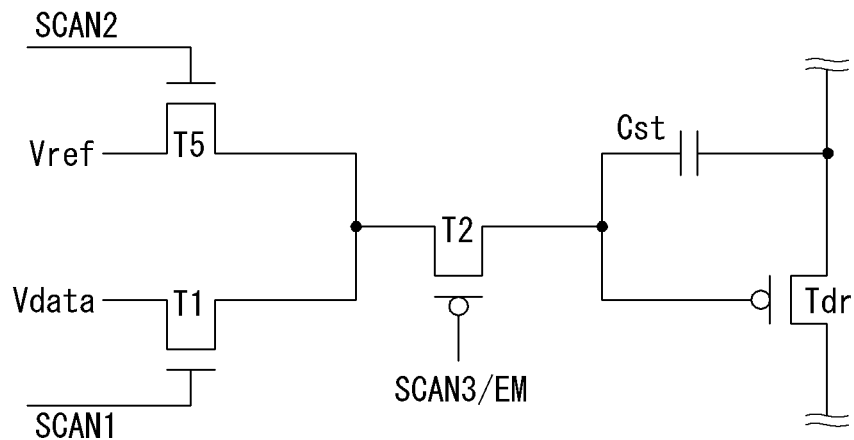
Figure 10:
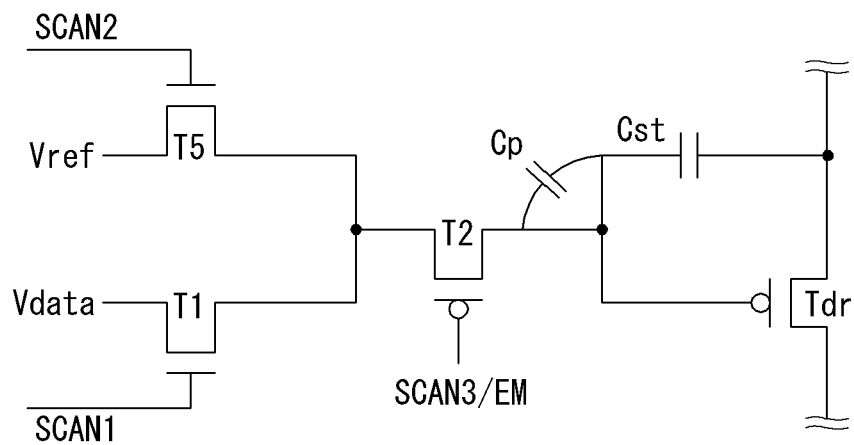
Figure 11:
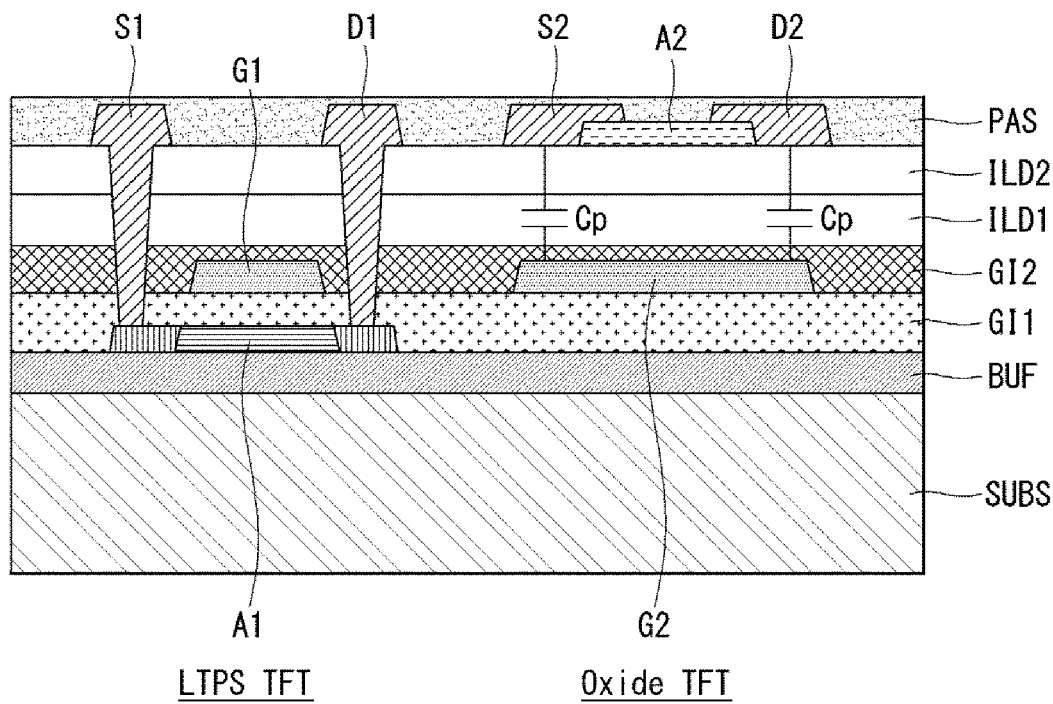
FIG. 11 is a cross-sectional view of a display panel illustrating a transistor of a top gate structure and a transistor of a bottom gate structure.

When the second switch element T2 is formed as the LTPS TFT of the top gate structure as shown in FIG. 11, a gate G1 and a source S1 of the second switch element T2 do not overlap each other, and the gate G1 and a drain D1 of the second switch element T2 do not overlap each other. As a result, because the parasitic capacitance Cp of the second switch element T2 is close to zero, an influence of the parasitic capacitance Cp can be minimized as shown in (c) of FIG. 10. As the influence of the parasitic capacitance Cp increases, the threshold voltage compensation rate of the driving element Tdr decreases. The pixel circuit according to the first embodiment of the disclosure can increase the threshold voltage compensation rate of the driving element Tdr because the parasitic capacitance Cp connected to the gate of the driving element Tdr is minimized in the initialization time Ti and the sampling time Ts. As a result, the first embodiment of the disclosure can prevent a reduction in the image quality and the image retention caused by a reduction in the compensation rate of the threshold voltage Vth of the driving element Tdr.

Figure 7:
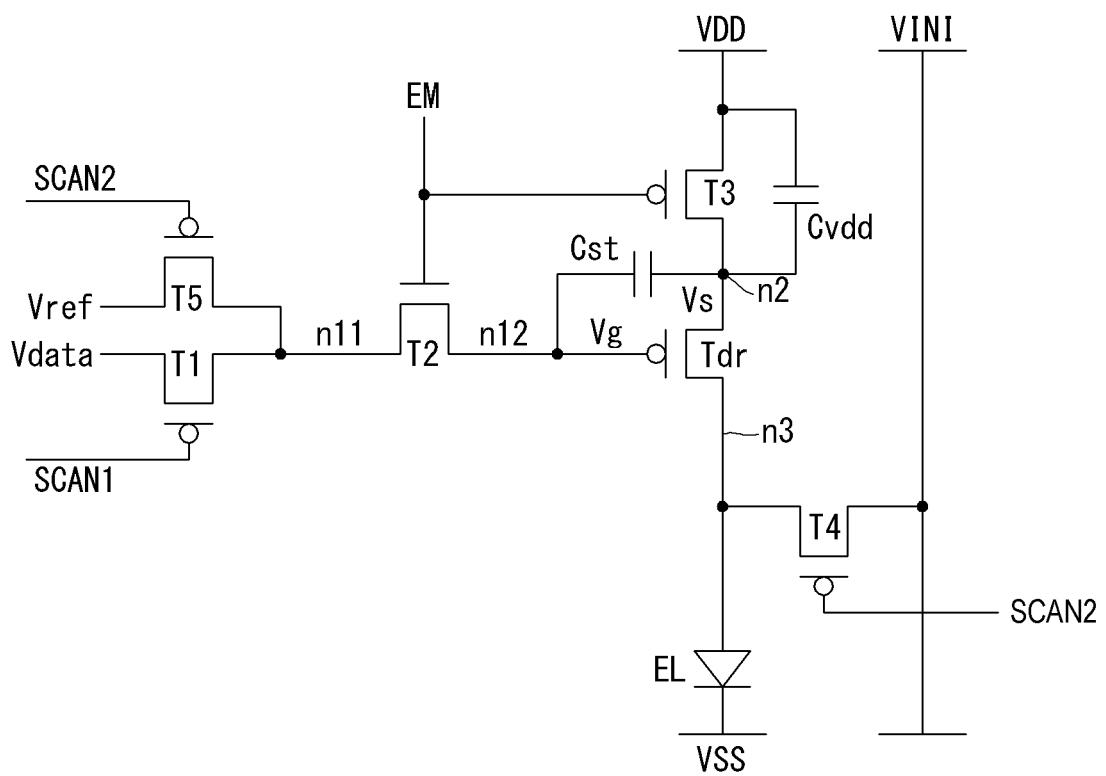
FIG. 7 is a circuit diagram of a pixel circuit according to a second embodiment of the disclosure.
Figure 8:
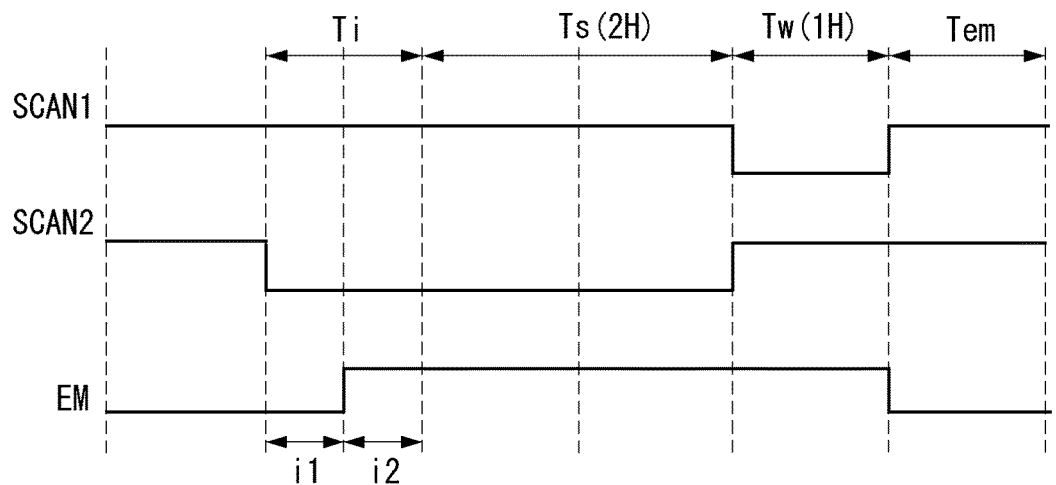
FIGS. 8 and 9 are waveform diagrams illustrating a method of driving a pixel circuit shown in FIG. 7.
Figure 9:
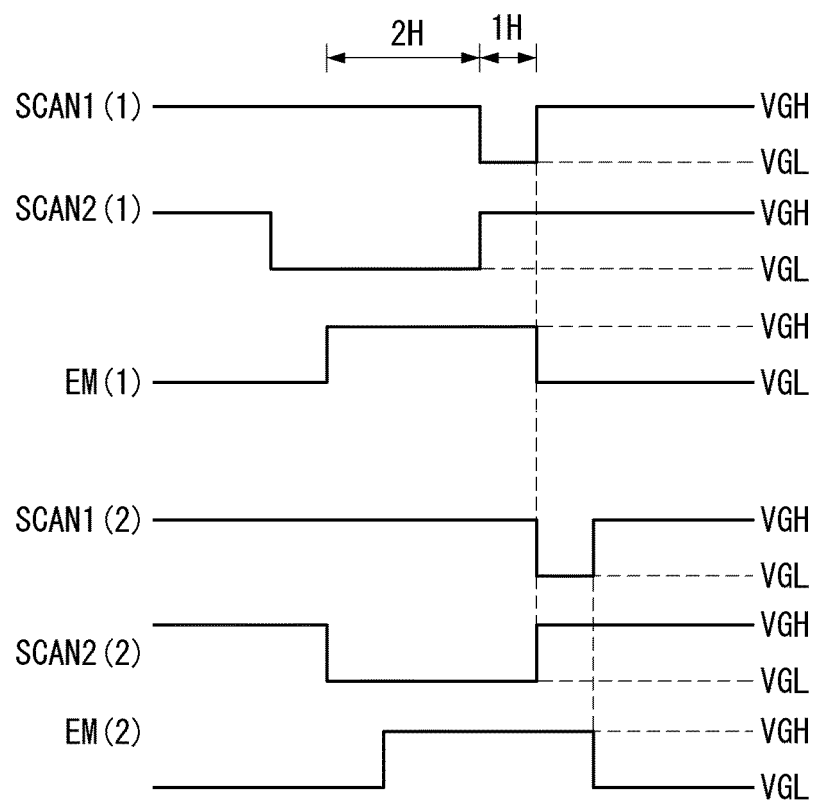

FIG. 7 is a circuit diagram of a pixel circuit according to a second embodiment of the disclosure. FIGS. 8 and 9 are waveform diagrams illustrating a method of driving the pixel circuit shown in FIG. 7. Structures and components identical or equivalent to those described in the first embodiment may be briefly made or may be entirely omitted in the second embodiment.

Referring to FIGS. 7 to 9, the pixel circuit according to the second embodiment of the disclosure includes a driving element Tdr connected to a light emitting element EL, first to fifth switch elements T1 to T5, a storage capacitor Cst, and the like.

The second switch element T2 may be implemented as an oxide TFT. The oxide TFT may be formed as an NMOS of a bottom gate structure as shown in FIG. 11. The other switch elements T1, T3, T4 and T5 and the driving element Tdr may be implemented as a LTPS TFT. The LTPS TFT may be formed as a PMOS of a top gate structure as shown in FIG. 11.

The first switch element T1 supplies a data voltage Vdata to a 1-1 node n11 in response to a first scan signal SCAN1 for a data writing time Tw. The first switch element T1 includes a gate connected to a first gate line supplied with the first scan signal SCAN1, a first electrode connected to a data line, and a second electrode connected to the 1-1 node n11.

The fifth switch element T5 supplies the Vref to the 1-1 node n11 in response to a second scan signal SCAN2 for an initialization time Ti and a sampling time Ts. The fifth switch element T5 includes a gate connected to a fifth gate line supplied with the second scan signal SCAN2, a first electrode connected to a third power line, and a second electrode connected to the 1-1 node n11.

The second switch element T2 connects the 1-1 node n11 to a 1-2 node n12 in response to an EM signal EM for a second initialization portion i2 of the initialization time Ti and the sampling time Ts. The second switch element T2 includes a gate connected to a second gate line supplied with the EM signal EM, a first electrode connected to the 1-1 node n11, and a second electrode connected to the 1-2 node n12. The second switch element T2 reduces a parasitic capacitance connected to a gate of the driving element Tdr for the initialization time Ti and the sampling time Ts. This will be described in detail with reference to FIGS. 10 and 11.

The third switch element T3 switches a current path between a first power line supplied with the VDD and the driving element Tdr in response to the EM signal EM. The third switch element T3 includes a gate connected to a third gate line supplied with the EM signal EM, a first electrode to which the VDD is applied through the first power line, and a second electrode connected to a second node n2. A capacitor Cvdd may be formed between the first electrode and the second electrode of the third switch element T3.

The fourth switch element T4 supplies the VINI to a third node n3 in response to a second scan signal SCAN2 for the initialization time Ti and the sampling time Ts. The fourth switch element T4 includes a gate connected to a fourth gate line supplied with the second scan signal SCAN2, a first electrode connected to the second power line, and a second electrode connected to the third node n3.

The driving element Tdr controls a current of the light emitting element EL depending on a source-to-gate voltage Vsg for an emission time Tem. The driving element Tdr includes a gate connected to the 1-2 node n12, a first electrode connected to the second node n2, and a second electrode connected to the third node n3.

The light emitting element EL includes an anode connected to the third node n3, a cathode connected to the VSS electrode, and an organic compound layer connected between the anode and the cathode. The organic compound layer may include a hole injection layer HIL, a hole transport layer HTL, an emission layer EML, an electron transport layer ETL, and an electron injection layer EIL. However, embodiments are not limited thereto. The storage capacitor Cst is connected between the gate and the first electrode of the driving element Tdr through the 1-2 node n12 and the second node n2.

The second and third switch elements T2 and T3 are turned on or off in response to the EM signal EM, and the fourth and fifth switch elements T4 and T5 are turned on or off in response to the second scan signal SCNA2. Thus, the pixel circuit according to the second embodiment of the disclosure does not require a gate signal for independently controlling the second and fourth switch elements T2 and T4. As a result, because the number of gate lines required to drive the pixel circuit and the number of channels of the gate driver 120 are reduced, the second embodiment of the disclosure can reduce a bezel area of the display panel and is advantageous to high resolution display panels.

A gate signal applied to pixels of a first pixel line LINE1 is SCAN1(1), SCAN2(1), and EM(1) of FIG. 9. A gate signal applied to pixels of a second pixel line LINE2 is SCAN1(2), SCAN2(2), and EM(2) of FIG. 9. The first scan signals SCAN1(1) and SCAN1(2) define the data writing time Tw. The second scan signals SCAN2(1) and SCAN2(2) define the initialization time Ti and the sampling time Ts.

Referring to FIGS. 8 and 9, when the initialization time Ti starts, a voltage of the second scan signal SCAN2 is inverted from the VGH to the VGL. The first scan signal SCAN1 is held at the VGH for the initialization time Ti.

The initialization time Ti includes a first initialization portion i1 in which a source voltage and a drain voltage of the driving element Tdr are initialized, and the second initialization portion i2 in which a gate voltage of the driving element Tdr is initialized. The EM signal EM is held at the VGL for the first initialization portion i1. The EM signal EM is inverted to the VGH when the second initialization portion i2 starts, and is held at the VGH until the data writing time Tw. The second switch element T2 is an NMOS transistor, and the other switch elements T1, T3, T4 and T5 and the driving element Tdr are PMOS transistors. Thus, the second switch element T2 is turned off in response to the EM signal EM for the first initialization portion i1 and then is turned on in the second initialization portion i2. The third switch element T3 is turned on in response to the EM signal EM for the first initialization portion i1 and then is turned off in the second initialization portion i2. The fourth and fifth switch elements T4 and T5 are turned on in response to the second scan signal SCNA2 for the initialization time Ti. The first switch element T1 maintains an off-state for the initialization time Ti. As a result, in the first initialization portion i1, the second node n2 is initialized to the VDD, and the third node n3 is initialized to the VINI. Subsequently, in the second initialization portion i2, a voltage of the 1-2 node n12, i.e., the gate voltage of the driving element Tdr is initialized to the Vref, and a voltage of the third node n3 is held at the VINI.

For the sampling time Ts, the first scan signal SCAN1 and the EM signal EM are held at the VGH, and the second scan signal SCAN2 is held at the VGL. The second switch element T2 is an NMOS transistor, and the other switch elements T1, T3, T4 and T5 and the driving element Tdr are PMOS transistors. Thus, in the sampling time Ts, the second, fourth, and fifth switch elements T2, T4 and T5 are turned on, and the first and third switch elements T1 and T3 are turned off. For the sampling time Ts, a source-to-gate voltage Vsg of the driving element Tdr increases by a threshold voltage Vth of the driving element Tdr, and the threshold voltage Vth is stored in the storage capacitor Cst.

When the data writing time Tw starts, the voltage of the first scan signal SCAN1 is inverted to the VGL. Further, when the data writing time Tw starts, the voltage of the second scan signal SCAN2 is inverted to the VGH, and the EM signal EM is held at a voltage of a previous state. The second switch element T2 is an NMOS transistor, and the other switch elements T1, T3, T4 and T5 and the driving element Tdr are PMOS transistors. Thus, in the data writing time Tw, the first and second switch elements T1 and T2 are turned on, and the other switch elements T3, T4 and T5 are turned off. In the data writing time Tw, the source-to-gate voltage Vsg of the driving element Tdr is changed to a data voltage Vdata that is compensated as much as the threshold voltage Vth of the driving element Tdr.

When the emission time Tem starts, the voltage of the first scan signal SCAN1 is inverted to the VGH, the voltage of the EM signal EM is inverted to the VGL, and the second scan signal SCAN2 is held at a voltage of a previous state. The second switch element T2 is an NMOS transistor, and the other switch elements T1, T3, T4 and T5 and the driving element Tdr are PMOS transistors. Thus, in the emission time Tem, the third switch element T3 is turned on, and the other switch elements T1, T2, T4 and T5 are turned off.

For the emission time Tem, a current Ioled flows in the light emitting element EL depending on the source-to-gate voltage Vsg of the driving element Tdr, and the light emitting element EL can emit light with the current Ioled.

When the second switch element T2 is formed as the oxide TFT of the bottom gate structure as shown in FIG. 11, a parasitic capacitance Cp is present in an overlap portion between a gate G2 and a source S2 of the second switch element T2. When the first and fifth switch elements T1 and T5 are directly connected to the gate of the driving element Tdr without the second switch element T2 as shown in (a) of FIG. 10, a parasitic capacitance present in the first and fifth switch elements T1 and T5 is connected to the driving element Tdr. On the other hand, the second embodiment of the disclosure can reduce the parasitic capacitance Cp by connecting the second switch element T2 to the gate of the driving element Tdr in the initialization time Ti and the sampling time Ts. The pixel circuit according to the second embodiment of the disclosure can reduce the parasitic capacitance Cp connected to the gate of the driving element Tdr to ½ or less and thus can increase a threshold voltage compensation rate of the driving element Tdr. As a result, the second embodiment of the disclosure can prevent a reduction in image quality and image retention caused by a reduction in the compensation rate of the threshold voltage Vth of the driving element Tdr. In addition, the second embodiment of the disclosure can reduce a bezel area of the display panel and is advantageous to the design of high resolution display panels by reducing the number of gate lines and the number of channels of the gate driver 120.

FIG. 10 is a circuit diagram illustrating a reduction in a parasitic capacitance connected to a gate of a driving element when a second switch element is connected to the gate of the driving element.

In FIG. 10, (a) illustrates an example where the first and fifth switch elements T1 and T5 are directly connected to the gate of the driving element Tdr without the second switch element T2. In this instance, a parasitic capacitance affecting the gate of the driving element Tdr increases due to the first and fifth switch elements T1 and T5. In particular, when the first and fifth switch elements T1 and T5 are implemented as an oxide TFT (or NMOS) of the bottom gate structure, in which there is a large vertical overlap area between a gate G2 and source and drain S2 and D2 of the transistor, as shown in FIG. 11, the parasitic capacitance connected to the gate of the driving element Tdr increases. Hence, the threshold voltage compensation rate of the driving element Tdr is reduced.

In FIG. 10, (b) illustrates an example where the second switch element T2 having the top gate structure is added to the first and fifth switch elements T1 and T5 and the driving element Tdr as in the pixel circuit according to the first embodiment of the disclosure. In this instance, only the second switch element T2 is connected to the gate of the driving element Tdr in the initialization time Ti and the sampling time Ts. When the second switch element T2 is a transistor of the top gate structure, a parasitic capacitance is hardly present in the second switch element T2. As a result, the pixel circuit according to the first embodiment of the disclosure can improve a threshold voltage compensation rate of the driving element Tdr because the parasitic capacitance connected to the gate of the driving element Tdr is minimized in the initialization time Ti and the sampling time Ts.

In FIG. 10, (c) illustrates an example where the second switch element T2 having the bottom gate structure is added to the first and fifth switch elements T1 and T5 and the driving element Tdr as in pixel circuits according to second to fourth embodiments of the disclosure. In this instance, only the second switch element T2 is connected to the gate of the driving element Tdr in the initialization time Ti and the sampling time Ts. A parasitic capacitance Cp connected to the gate of the driving element Tdr in (c) of FIG. 10, in which the second switch element T2 of the bottom gate structure is added, is reduced to ½ or less of the parasitic capacitance Cp in (a) of FIG. 10. As a result, the parasitic capacitance Cp connected to the gate of the driving element Tdr is reduced, and a threshold voltage compensation rate of the driving element Tdr is improved. Because the second switch element T2 is implemented as the oxide TFT in the pixel circuits according to the second to fourth embodiments of the disclosure, a leakage current between the fifth switch element T5 and the driving element Tdr can be prevented in the data writing time Tw and the emission time Tem.

FIG. 11 is a cross-sectional view of a display panel illustrating a transistor of a top gate structure and a transistor of a bottom gate structure.

Referring to FIG. 11, the display panel 100 according to embodiments of the disclosure includes a plurality of transistors (e.g., oxide TFT, LTPS TFT, etc.) arranged on the pixel array. The transistors (e.g., oxide TFT, LTPS TFT, etc.) include the driving element Tdr and the switch elements T1 to T5 of the pixel circuit. The storage capacitor Cst, the light emitting element EL, etc. are formed on the substrate of the display panel 100 together with the transistors Tdr and T1 to T5. In FIG. 11, the storage capacitor Cst and the light emitting element EL are omitted.

The oxide TFT may be formed as an NMOS of a bottom gate structure in which a gate G2 is disposed below a semiconductor pattern A2. The LTPS TFT may be formed as a PMOS of a top gate structure in which a gate G1 is disposed on a semiconductor pattern A1.

The LTPS TFT includes the semiconductor pattern A1, the gate G1 on the semiconductor pattern A1, a first electrode S1 contacting a drain region of the semiconductor pattern A1, and a second electrode D1 contacting a source region of the semiconductor pattern A1. The semiconductor pattern A1 may include polycrystalline silicon.

The oxide TFT includes the semiconductor pattern A2, the gate G2 disposed below the semiconductor pattern A2, a first electrode S2 contacting a drain region of the semiconductor pattern A2, and a second electrode D2 contacting a source region of the semiconductor pattern A2. The semiconductor pattern A2 may be formed of an oxide semiconductor material including at least one of indium gallium zinc oxide (IGZO), indium gallium oxide (IGO), and indium zinc oxide (IZO).

A buffer layer BUF is deposited on the entire surface of a substrate SUBS. The buffer layer BUF may be omitted, if necessary or desired. The first semiconductor pattern A1 is formed on the buffer layer BUF. The source region and the drain region of the first semiconductor pattern A1 are doped with $p^+$ ions.

A first gate insulating layer GI1 is formed on the buffer layer BUF to cover the first semiconductor pattern A1, and first metal patterns are deposited on the first gate insulating layer GI1. The first metal patterns include the gate G1 of the LTPS TFT and the gate G2 of the oxide TFT. A second gate insulating layer GI2 is formed on the first gate insulating layer GI1 to cover the first metal patterns.

A first interlayer dielectric layer ILD1 and a second interlayer dielectric layer ILD2 are laminated on the second gate insulating layer GI2, and the second semiconductor pattern A2 and second metal patterns are formed on the first interlayer dielectric layer ILD1 and the second interlayer dielectric layer ILD2. The second metal patterns include the first and second electrodes S1, D1, S2, and D2 of the LTPS TFT and the oxide TFT. The first and second electrodes S1 and D1 of the LTPS TFT respectively contact the source region and the drain region of the first semiconductor pattern A1 through contact holes passing through the insulating layer. The first and second electrodes S2 and D2 of the oxide TFT are formed on the second semiconductor pattern A2 and directly contact the source region and the drain region of the second semiconductor pattern A2. A passivation layer PAS is covered on the transistors (e.g., oxide TFT, LTPS TFT, etc.).

The first and fifth switch elements T1 and T5 separate a data voltage path and a reference voltage path connected to the pixel circuit. When the data voltage path and the reference voltage path are separated from each other as described above, the sampling time Ts in which the reference voltage is applied can increase to a period of time (for example, two horizontal periods) longer than one horizontal period. Because of this, the pixel circuit according to embodiments of the disclosure can secure the sufficient sampling time in high resolution and high speed display panels. When the data voltage path and the reference voltage path are one data line and one switch element, the sampling time may be insufficient because the sampling time and the data writing time are time-divided within one horizontal period. In addition, the sampling time may be considerably insufficient in the high resolution and high speed display panels.

In addition, the structure, in which the data voltage path and the reference voltage path connected to the pixel circuit are separated from each other using the first and fifth switch elements T1 and T5, can sufficiently secure the sampling time and simply sense the threshold voltage of the switch element. Such a sensing method is disclosed in detail in Korean Patent Application No. 10-2016-0158431 (filed on Nov. 25, 2016) corresponding to the present applicant, and which is hereby incorporated by reference in their entirety. The sensing method will be described with reference to FIG. 12.

Figure 12:
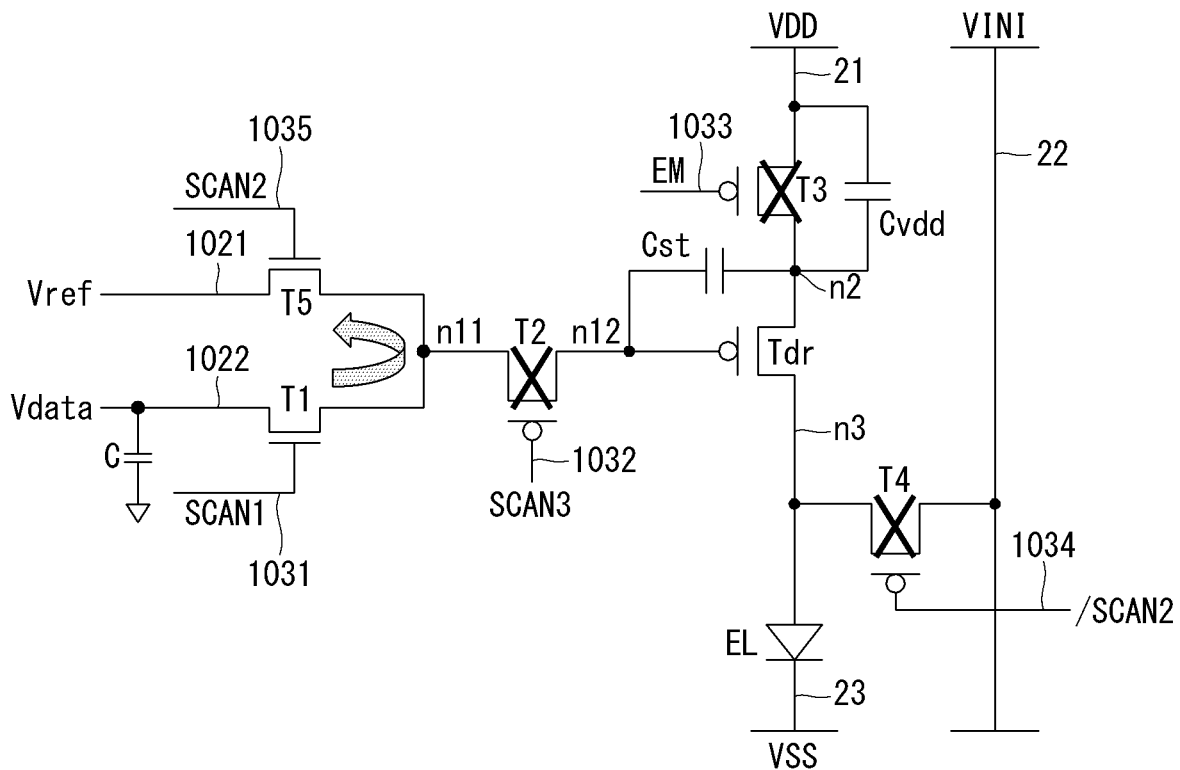
FIG. 12 illustrates a method of sensing a threshold voltage of a switch element in a sensing mode.
Figure 12:
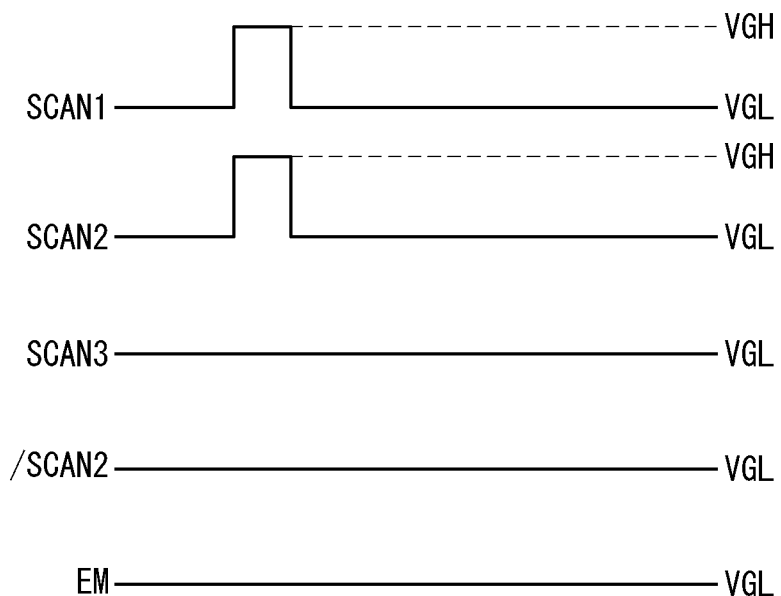
Figure 13:
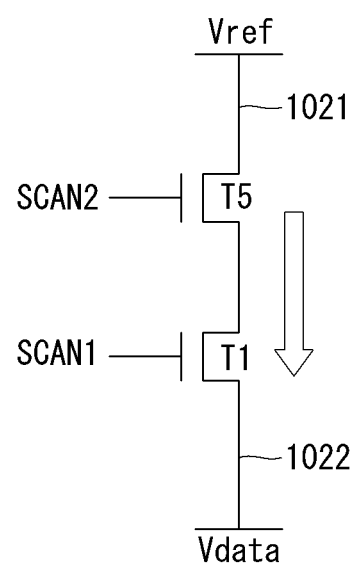
FIG. 13 illustrates a current flowing through first and fifth switch elements in a sensing mode.
Figure 14:
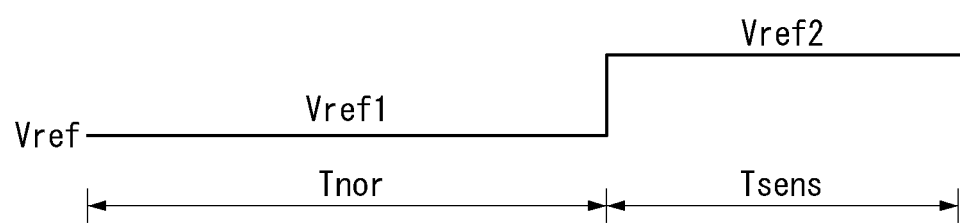
FIG. 14 illustrates am example where a reference voltage increases in a sensing mode.

FIGS. 12 to 14 illustrate a method of sensing a threshold voltage of a switch element in a sensing mode. In FIG. 14, "Tnor" denotes a normal driving mode, and "Tsens" denotes a sensing mode. In FIG. 14, "Vref" is set to a voltage (for example, "Vref1" of FIG. 14) lower than the VDD in the normal driving mode, in which an input image is displayed on the screen, and the low power consumption driving mode. Alternatively, "Vref" may be set to a sufficient high voltage (for example, "Vref2" of FIG. 14) in order to supply a current to a current path including the first and fifth switch elements T1 and T5 in the sensing mode.

Referring to FIGS. 12 to 14, in the sensing mode Tsens, the first and second scan signals SCAN1 and SCAN2 are generated at the gate-on voltage, and the remaining gate signals are generated at the gate-off voltage. In the sensing mode Tsens, the first and fifth switch elements T1 and T5 are turned on, and thus a path of current flowing from the third power line 1021 to the data line 1022 can be formed.

Because the voltage of the second scan signal SCAN2 is generated at a voltage higher than the Vref2 in the sensing mode Tsens, a channel of the first switch T1 is completely opened when the fifth switch element T5 is turned on. When a gate-to-source voltage of the first switch element T1 is equal to the threshold voltage of the driving element Tdr, the first switch element T1 is turned off. In this instance, a threshold voltage of the third switch element T3 can be found by comparing a voltage charged to the data line 1022, i.e., a voltage charged to a parasitic capacitance of the data line 1022 with the Vref2. In the sensing mode Tsens, a difference between the voltage of the data line 1022 and the Vref2 is a threshold voltage of the first switch element T1. Thus, in the sensing mode Tsens, the threshold voltage of the first switch element T1 can be sensed by the difference between the voltage of the data line 1022 and the Vref2.

Figure 15:
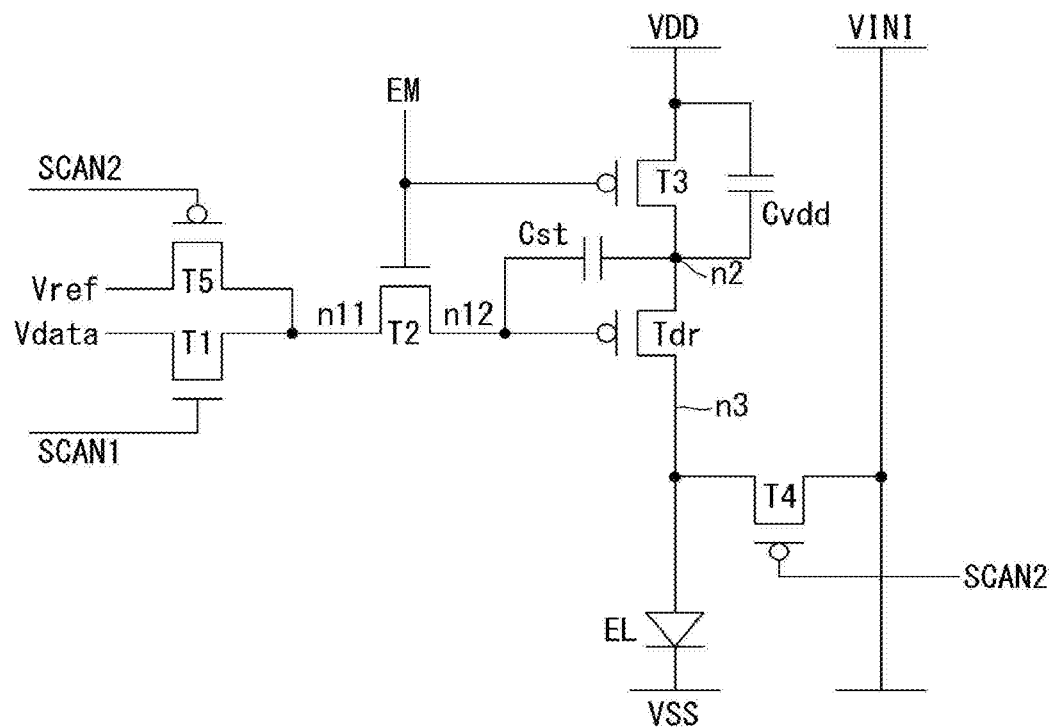
FIG. 15 is a circuit diagram of a pixel circuit according to a third embodiment of the disclosure.
Figure 16:
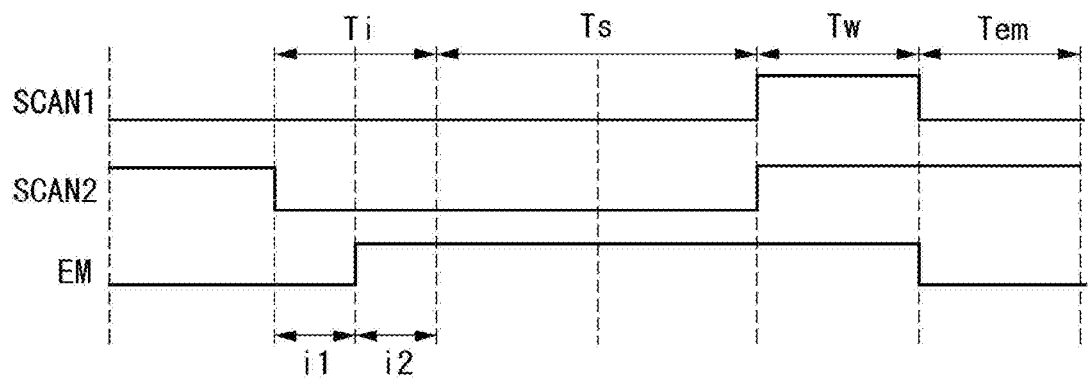
FIGS. 16 and 17 are waveform diagrams illustrating a method of driving a pixel circuit shown in FIG. 15.
Figure 17:
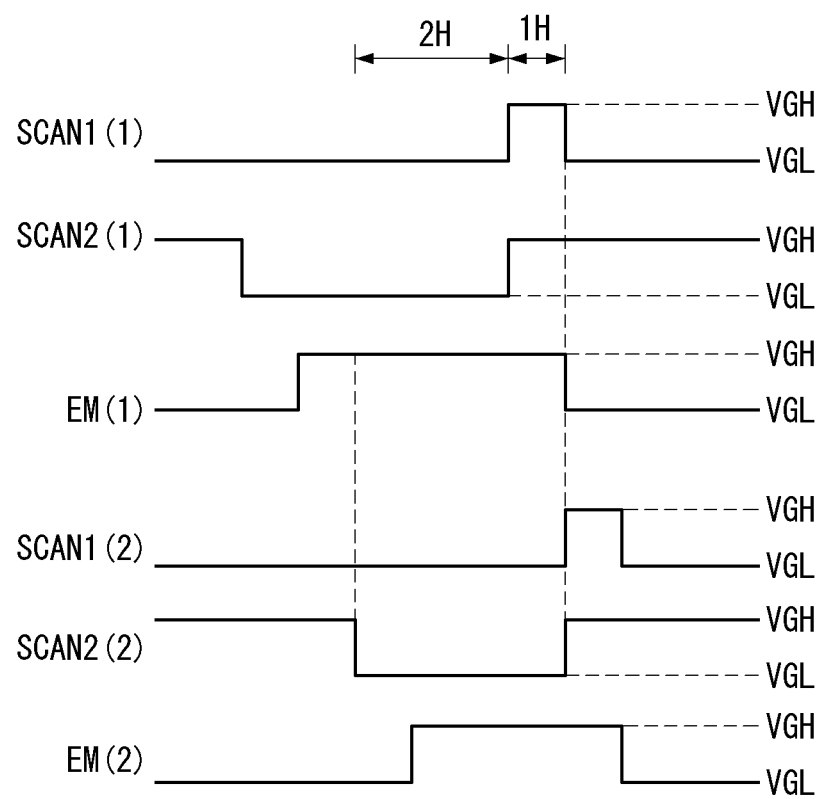

FIG. 15 is a circuit diagram of a pixel circuit according to a third embodiment of the disclosure. FIGS. 16 and 17 are waveform diagrams illustrating a method of driving the pixel circuit shown in FIG. 15. The third embodiment of the disclosure is substantially the same as the second embodiment of the disclosure, except that a first switch element T1 is an oxide TFT implemented as an NMOS of a bottom gate structure, and a phase of a first scan signal SCAN1 for controlling the first switch element T1 is reversed. Structures and components identical or equivalent to those described in the second embodiment may be briefly made or may be entirely omitted in the third embodiment.

Referring to FIGS. 15 to 17, the pixel circuit according to the third embodiment of the disclosure includes a driving element Tdr connected to a light emitting element EL, first to fifth switch elements T1 to T5, a storage capacitor Cst, and the like.

When an initialization time Ti starts, a voltage of a second scan signal SCAN2 is inverted from the VGH to the VGL. A first scan signal SCAN1 is held at the VGL for the initialization time Ti. The initialization time Ti includes a first initialization portion i1 and a second initialization portion i2. An EM signal EM is held at the VGL for the first initialization portion i1. The EM signal EM is inverted to the VGH when the second initialization portion i2 starts, and is held at the VGH until a data writing time Tw. The first and second switch elements T1 and T2 are NMOS transistors, and the other switch elements T3, T4 and T5 and the driving element Tdr are PMOS transistors. Thus, the fourth and fifth switch elements T4 and T5 are turned on in response to the second scan signal SCAN2 for the initialization time Ti. The second switch element T2 is turned off in response to the EM signal EM for the first initialization portion i1 and then is turned on in the second initialization portion i2. The third switch element T3 is turned on in response to the EM signal EM for the first initialization portion i1 and then is turned off in the second initialization portion i2. The fourth and fifth switch elements T4 and T5 are turned on in response to the second scan signal SCAN2 for the initialization time Ti. The first switch element T1 maintains an off-state for the initialization time Ti. As a result, in the first initialization portion i1, a second node n2 is initialized to the VDD, and a third node n3 is initialized to the VINI. In the second initialization portion i2 subsequent to the first initialization portion i1, a voltage of a 1-2 node n12, i.e., a gate voltage of the driving element Tdr is initialized to the Vref, and a voltage of the third node n3 is held at the VINI.

For a sampling time Ts, the first and second scan signals SCAN1 and SCAN2 are held at the VGL, and the EM signal EM is held at the VGH. The first and second switch elements T1 and T2 are NMOS transistors, and the other switch elements T3, T4 and T5 and the driving element Tdr are PMOS transistors. Thus, in the sampling time Ts, the second, fourth, and fifth switch elements T2, T4 and T5 are turned on, and the first and third switch elements T1 and T3 are turned off. For the sampling time Ts, a source-to-gate voltage Vsg of the driving element Tdr increases by a threshold voltage Vth of the driving element Tdr, and the threshold voltage Vth is stored in the storage capacitor Cst.

When a data writing time Tw starts, the voltages of the first and second scan signals SCAN1 and SCAN2 are inverted to the VGH. Further, when the data writing time Tw starts, the EM signal EM is held at the VGH. The first and second switch elements T1 and T2 are NMOS transistors, and the other switch elements T3, T4 and T5 and the driving element Tdr are PMOS transistors. Thus, in the data writing time Tw, the first and second switch elements T1 and T2 are turned on, and the other switch elements T3, T4 and T5 are turned off. In the data writing time Tw, the source-to-gate voltage Vsg of the driving element Tdr is changed to a data voltage Vdata that is compensated as much as the threshold voltage Vth of the driving element Tdr.

When an emission time Tem starts, the voltage of the first scan signal SCAN1 is inverted to the VGL, the voltage of the EM signal EM is inverted to the VGL, and the second scan signal SCAN2 is held at the VGH. The first and second switch elements T1 and T2 are NMOS transistors, and the other switch elements T3, T4 and T5 and the driving element Tdr are PMOS transistors. Thus, in the emission time Tem, the third switch element T3 is turned on, and the other switch elements T1, T2, T4 and T5 are turned off.

For the emission time Tem, a current Ioled flows in the light emitting element EL depending on the source-to-gate voltage Vsg of the driving element Tdr, and the light emitting element EL can emit light with the current Ioled.

When the second switch element T2 is formed as the oxide TFT of the bottom gate structure as shown in FIG. 11, only a parasitic capacitance Cp of the second switch element T2 is connected to a gate of the driving element Tdr for the initialization time Ti and the sampling time Ts. Thus, the pixel circuit according to the third embodiment of the disclosure can reduce the parasitic capacitance Cp connected to the gate of the driving element Tdr and thus can increase a threshold voltage compensation rate of the driving element Tdr. As a result, the third embodiment of the disclosure can prevent a reduction in image quality and image retention caused by a reduction in the compensation rate of a threshold voltage Vth of the driving element Tdr. In addition, the third embodiment of the disclosure can reduce a bezel area of the display panel and is advantageous to the design of high resolution display panels by reducing the number of gate lines and the number of channels of the gate driver 120.

Figure 18:
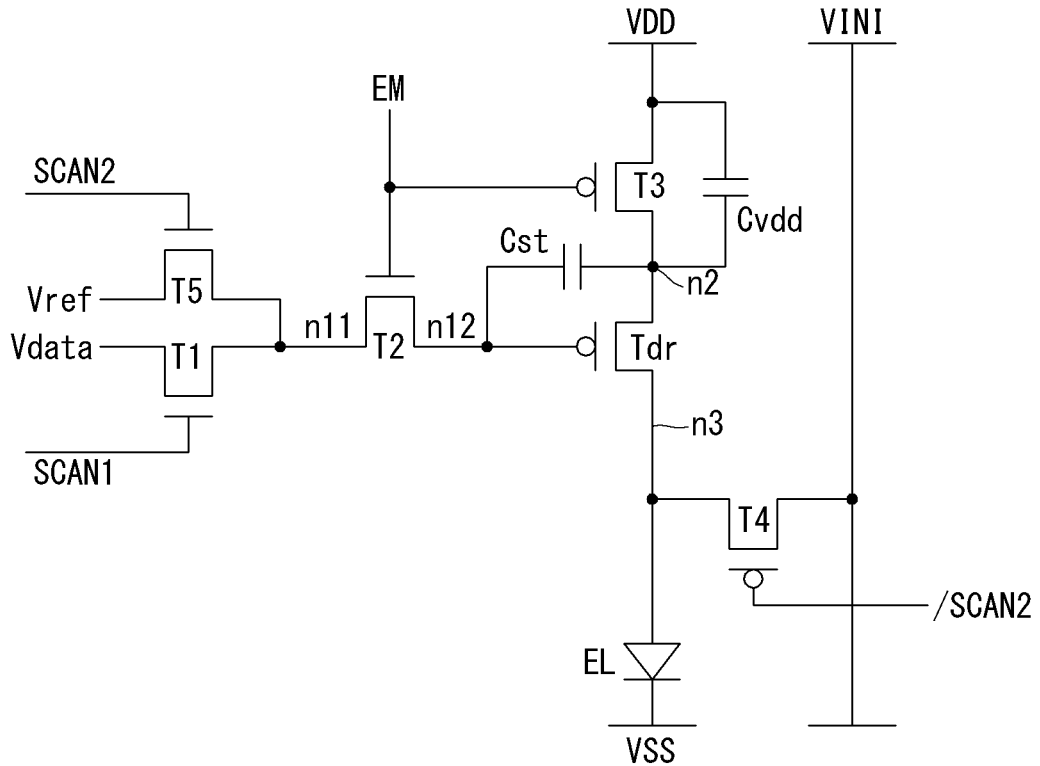
FIG. 18 is a circuit diagram of a pixel circuit according to a fourth embodiment of the disclosure.
Figure 19:
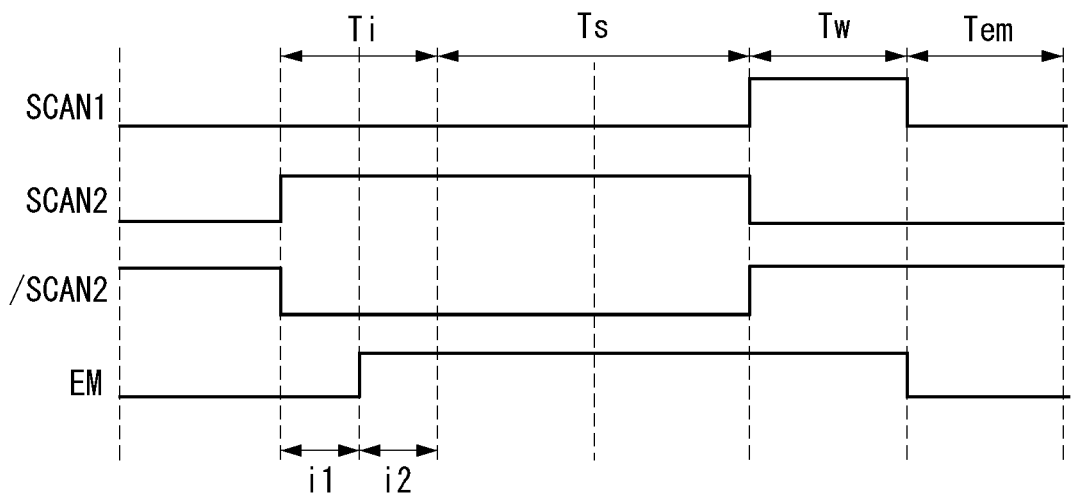
FIGS. 19 and 20 are waveform diagrams illustrating a method of driving a pixel circuit shown in FIG. 18.
Figure 20:
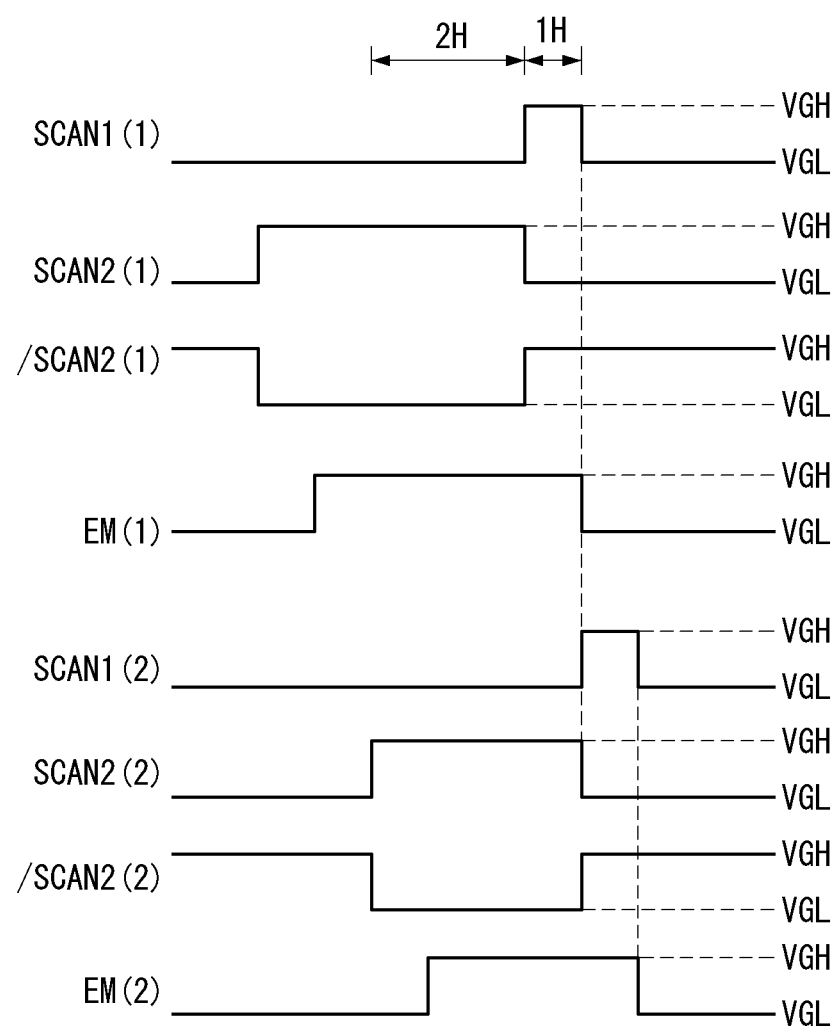

FIG. 18 is a circuit diagram of a pixel circuit according to a fourth embodiment of the disclosure. FIGS. 19 and 20 are waveform diagrams illustrating a method of driving the pixel circuit shown in FIG. 18. The fourth embodiment of the disclosure is substantially the same as the second embodiment of the disclosure, except that first and fifth switch elements T1 and T5 are oxide TFTs implemented as NMOS transistors of a bottom gate structure, phases of first and second scan signals SCAN1 and SCAN2 for controlling the first and fifth switch elements T1 and T5 are reversed, and an inverted second scan signal /SCAN2 is added. Structures and components identical or equivalent to those described in the second embodiment may be briefly made or may be entirely omitted in the fourth embodiment.

Referring to FIGS. 18 to 20, the pixel circuit according to the fourth embodiment of the disclosure includes a driving element Tdr connected to a light emitting element EL, first to fifth switch elements T1 to T5, a storage capacitor Cst, and the like.

When an initialization time Ti starts, a voltage of a second scan signal SCAN2 is inverted to the VGH, and a voltage of an inverted second scan signal /SCAN2 is inverted to the VGL. A first scan signal SCAN1 is held at the VGL for the initialization time Ti. The initialization time Ti includes a first initialization portion i1 and a second initialization portion i2. An EM signal EM is held at the VGL for the first initialization portion i1. The EM signal EM is inverted to the VGH when the second initialization portion i2 starts, and is held at the VGH until a data writing time Tw. The first, second, and fifth switch elements T1, T2 and T5 are NMOS transistors, and the third and fourth switch elements T3 and T4 and the driving element Tdr are PMOS transistors. Thus, the fourth and fifth switch elements T4 and T5 are turned on in response to the second scan signal SCAN2 for the initialization time Ti. The second switch element T2 is turned off in response to the EM signal EM for the first initialization portion i1 and then is turned on in the second initialization portion i2. The third switch element T3 is turned on in response to the EM signal EM for the first initialization portion i1 and then is turned off in the second initialization portion i2. The first switch element T1 maintains an off-state for the initialization time Ti. As a result, in the first initialization portion i1, a second node n2 is initialized to the VDD, and a third node n3 is initialized to the VINI. In the second initialization portion i2 subsequent to the first initialization portion i1, a voltage of a 1-2 node n12, i.e., a gate voltage of the driving element Tdr is initialized to the Vref, and a voltage of the third node n3 is held at the VINI.

For a sampling time Ts, the first scan signal SCAN1 and the inverted second scan signal /SCAN2 are held at the VGL, and the second scan signal SCAN2 and the EM signal EM are held at the VGH. The first, second, and fifth switch elements T1, T2 and T5 are NMOS transistors, and the third and fourth switch elements T3 and T4 and the driving element Tdr are PMOS transistors. Thus, in the sampling time Ts, the second, fourth, and fifth switch elements T2, T4 and T5 are turned on, and the first and third switch elements T1 and T3 are turned off. For the sampling time Ts, a source-to-gate voltage Vsg of the driving element Tdr increases by a threshold voltage Vth of the driving element Tdr, and the threshold voltage Vth is stored in the storage capacitor Cst.

When a data writing time Tw starts, the voltage of the first scan signal SCAN1 and the voltage of the inverted second scan signal /SCAN2 are inverted to the VGH. Further, when the data writing time Tw starts, the EM signal EM is held at the VGH. The first, second, and fifth switch elements T1, T2 and T5 are NMOS transistors, and the third and fourth switch elements T3 and T4 and the driving element Tdr are PMOS transistors. Thus, in the data writing time Tw, the first and second switch elements T1 and T2 are turned on, and the other switch elements T3, T4 and T5 are turned off. In the data writing time Tw, the source-to-gate voltage Vsg of the driving element Tdr is changed to a data voltage Vdata that is compensated as much as the threshold voltage Vth of the driving element Tdr.

When an emission time Tem starts, the voltage of the first scan signal SCAN1 is inverted to the VGL, and the voltage of the EM signal EM is inverted to the VGL. The first, second, and fifth switch elements T1, T2 and T5 are NMOS transistors, and the third and fourth switch elements T3 and T4 and the driving element Tdr are PMOS transistors. Thus, in the emission time Tem, the third switch element T3 is turned on, and the other switch elements T1, T2, T4 and T5 are turned off.

For the emission time Tem, a current Ioled flows in the light emitting element EL depending on the source-to-gate voltage Vsg of the driving element Tdr, and the light emitting element EL can emit light with the current Ioled.

When the second switch element T2 is formed as the oxide TFT of the bottom gate structure as shown in FIG. 11, only a parasitic capacitance Cp of the second switch element T2 is connected to a gate of the driving element Tdr for the initialization time Ti and the sampling time Ts. Thus, the pixel circuit according to the fourth embodiment of the disclosure can reduce the parasitic capacitance Cp connected to the gate of the driving element Tdr and thus can increase a threshold voltage compensation rate of the driving element Tdr. As a result, the fourth embodiment of the disclosure can prevent a reduction in image quality and image retention caused by a reduction in the compensation rate of a threshold voltage Vth of the driving element Tdr. In addition, the fourth embodiment of the disclosure can reduce a bezel area of the display panel and is advantageous to the design of high resolution display panels by reducing the number of gate lines and the number of channels of the gate driver 120.

Figure 21:
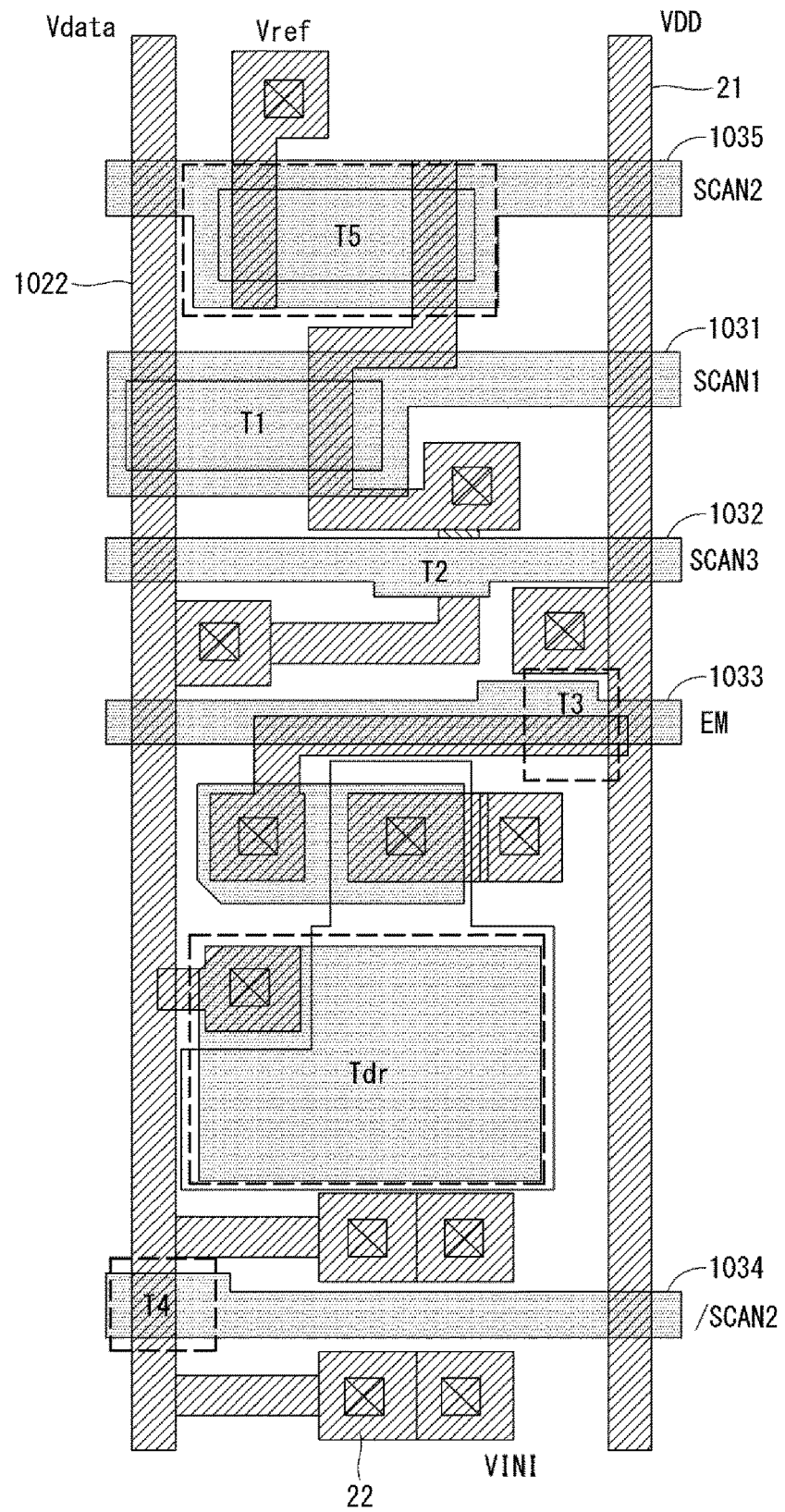
FIG. 21 is a plan view illustrating a planar structure of a pixel circuit shown in FIG. 4.
Figure 22:
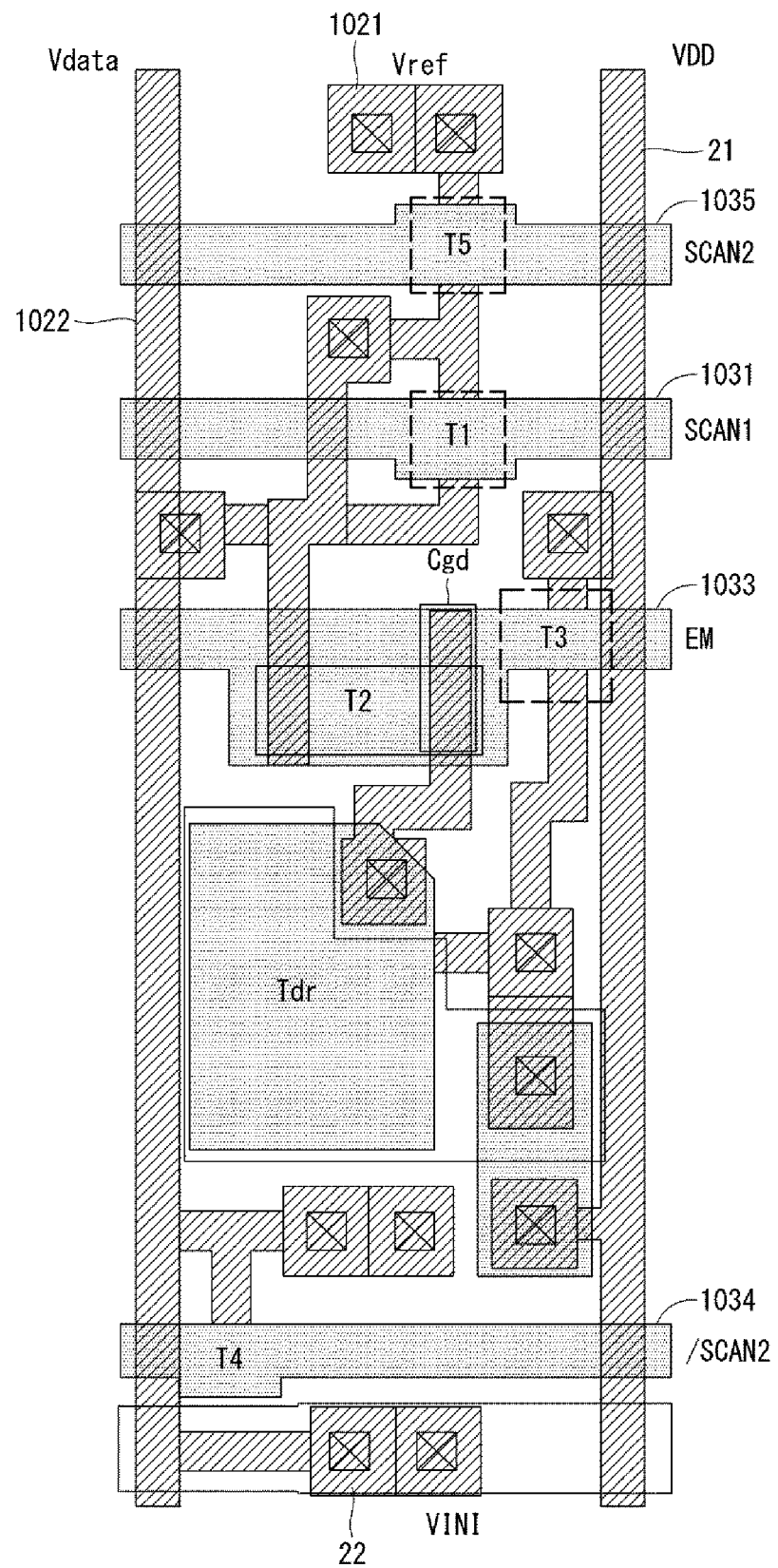
FIG. 22 is a plan view illustrating a planar structure of a pixel circuit shown in FIG. 7.

FIG. 21 is a plan view illustrating a planar structure of the pixel circuit shown in FIG. 4. FIG. 22 is a plan view illustrating a planar structure of the pixel circuit shown in FIG. 7.

When the second switch element T2 is formed as the LTPS TFT of the top gate structure, a parasitic capacitance Cp is hardly present in the second switch element T2 as shown in FIG. 21 because the gate and the source of the second switch element T2 do not overlap each other. Alternatively, when the second switch element T2 is formed as the oxide TFT of the bottom gate structure, a parasitic capacitance Cp is present in the second switch element T2. However, the parasitic capacitance Cp connected to the gate of the driving element Tdr when the second switch element T2 of the bottom gate structure is added can be reduced to ½ or less, compared to when the first and fifth switch elements T1 and T5 are directly connected to the gate of the driving element Tdr without the second switch element T2.

As described above, the embodiments of the disclosure can compensate for the threshold voltage of the driving element using the pixel circuit including the internal compensation circuit to drive the light emitting element, and can separate the data voltage path and the reference voltage path connected to the pixel circuit to thereby sufficiently secure the sampling time of the driving element in the high resolution and high speed display panels. Further, the embodiments of the disclosure can sense the threshold voltages of the switch elements using a current path connecting the switch elements on the data voltage path and the reference voltage path.

The embodiments of the disclosure can improve the threshold voltage compensation rate of the driving element by reducing the parasitic capacitance connected to the driving element for the initialization time and the sampling time, thereby improving the image quality and preventing the image retention. Furthermore, the embodiments of the disclosure can reduce the number of gate lines and the number of channels of the gate driver because a control signal for controlling the switch element connected to the gate of the driving element and the switch element controlling the emission time is one gate signal, that is, one EM signal, for the initialization time and the sampling time, thereby reducing the bezel area of the display panel and being advantageous to the design of the high resolution display panels.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A circuit comprising:
a substrate;
a buffer layer overlying the substrate;
a light emitting device overlying the substrate and the buffer layer;
a driving voltage node;
a driving element having a first terminal, a second terminal, and a first gate terminal, the first terminal coupled to the driving voltage node, the second terminal coupled to the light emitting device;
a reference voltage node configured to provide a reference voltage via a reference line;
a data voltage node configured to provide a data voltage via a data line different from the reference line;
a second switch element having a fourth terminal, a fifth terminal, and a second gate terminal, the fourth terminal coupled to the first gate terminal of the driving element, the fifth terminal configured to receive a voltage corresponding to either the reference voltage from the reference voltage node or the data voltage from the data voltage node;
a third switch element coupled between the first terminal of the driving element and the driving voltage node, the third switch element having a third gate terminal;
a common gate line supplied with an emission control signal and coupled to the second gate terminal of the second switch element and the third gate terminal of the third switch element;
an initialization voltage node;
a fourth switch element coupled between the second terminal of the driving element and the initialization voltage node, the fourth switch element being turned on during an initialization time and a sampling time in one horizontal period, wherein the initialization time includes a first period and a second period;
a fifth switch element coupled between the reference voltage node and the fifth terminal, the fifth switch element being turned on to supply the reference voltage to the second switch element during the initialization time and the sampling time;
a first switch element, wherein the fifth terminal is coupled to the data voltage node through the first switch element different from the fifth switch element;
a first capacitor having a first plate coupled to the first gate terminal and a second plate coupled to the first terminal of the driving element,
wherein, during the first period of the initialization time, the third switch element is turned on in response to the emission control signal of a first voltage level to supply a driving voltage to the driving element,
wherein, during the second period of the initialization time and the sampling time, the second switch element is turned on in response to the emission control signal of a second voltage level to supply the reference voltage receiving through the fifth switch element to the driving element,
wherein the initialization time, the sampling time, the data writing time, and an emission time are contiguous and in the sequence of the initialization time, the sampling time, the data writing time, and then the emission time,
wherein the first switch element and the second switch element include a thin film transistor formed as an NMOS of a bottom gate structure,
wherein at least one of the driving element, the third switch element, the fourth switch element, and the fifth switch element include a polycrystalline silicon thin film transistor formed as a PMOS of a top gate structure, that includes:
a polycrystalline silicon overlying the buffer layer;
a first gate insulating layer overlying the polycrystalline silicon; and
a first gate overlying the first gate insulating layer;
wherein the second switch element formed as the NMOS of a bottom gate structure includes:
a second gate formed on the first gate insulating layer and constituting the second gate terminal;
a second gate insulating layer formed on the first gate insulating layer and overlying the first and second gates;
at least one interlayer dielectric layer formed on the second gate insulating layer;
a semiconductor pattern formed on the at least one interlayer dielectric layer; and
first and second electrodes formed on the semiconductor pattern and directly contacting a source region and a drain region of the second semiconductor pattern, the first and second electrodes each constituting the fourth terminal and the fifth terminal; and
wherein the second gate of the second switch element overlaps the first and second electrodes.

2. The circuit of claim 1, further comprising a second capacitor coupled between the first terminal of the driving element and the driving voltage node and in parallel with the third switch element.

3. The circuit of claim 1, wherein the driving voltage node is configured to receive the driving voltage and the reference voltage node is configured to receive the reference voltage lower than the driving voltage.

4. The circuit of claim 1, wherein the first voltage level of the emission control signal is lower than the second voltage level of the emission control signal.

5. The circuit of claim 1, wherein the data wiring time is one horizontal period, and the sampling time is two horizontal periods.

6. The circuit of claim 1, wherein the second switch element is directly coupled between the first gate terminal of the driving element and the first and fifth switch elements, and reduces a parasitic capacitance affected to the driving element.

7. The circuit of claim 1, wherein the first switch element is controlled by a first scan signal and the fifth switch element is controlled by a second scan signal, and each waveform of the first scan signal and the second scan signal is different.

\* \* \* \* \*